US007478558B2

(12) United States Patent
Fujii et al.

(10) Patent No.: US 7,478,558 B2
(45) Date of Patent: Jan. 20, 2009

(54) PIEZOELECTRIC ELEMENT, INK JET HEAD, ANGULAR VELOCITY SENSOR, METHOD FOR MANUFACTURING THE SAME, AND INK JET RECORDING APPARATUS

(75) Inventors: Eiji Fujii, Osaka (JP); Hideo Torii, Osaka (JP); Ryoichi Takayama, Osaka (JP); Atsushi Tomozawa, Osaka (JP); Akiko Murata, Osaka (JP); Taku Hirasawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 403 days.

(21) Appl. No.: 11/362,583

(22) Filed: Feb. 24, 2006

(65) Prior Publication Data

US 2006/0146097 A1 Jul. 6, 2006

Related U.S. Application Data

(62) Division of application No. 10/472,589, filed as application No. PCT/JP02/13040 on Dec. 12, 2002, now Pat. No. 7,033,001.

(30) Foreign Application Priority Data

| | | |
|---|---|---|
| Dec. 18, 2001 | (JP) | 2001-384313 |
| Dec. 18, 2001 | (JP) | 2001-384314 |
| May 14, 2002 | (JP) | 2002-138793 |

(51) Int. Cl.
*G01C 19/00* (2006.01)
*B41J 2/045* (2006.01)
*H01L 41/04* (2006.01)

(52) U.S. Cl. ....................... 73/504.16; 347/68; 310/363

(58) Field of Classification Search .................. 73/1.37, 73/504.16, 511, 513; 310/358, 363, 364; 252/62.9 PZ; 347/68–72
See application file for complete search history.

(56) References Cited

U.S. PATENT DOCUMENTS 5,508,953 A 4/1996 Fukuda et al.

(Continued)

FOREIGN PATENT DOCUMENTS

EP 1168465 A 1/2002

(Continued)

OTHER PUBLICATIONS

Takayama, et al., "Preparation of epitaxial Pb(Zr,Ti1-x)O3 thin films and their crystallographic, pyroelectric, and ferroelectric properties", Journal of Applied Physics, vol. 65, No. 4, pp. 1666-1670, Feb. 15, 1989.

(Continued)

*Primary Examiner*—Stephen D Meier
*Assistant Examiner*—Geoffrey Mruk
(74) *Attorney, Agent, or Firm*—Harness, Dickey & Pierce, P.L.C.

(57) ABSTRACT

In a piezoelectric element, an adhesive layer 12 is provided on a substrate 11, a first electrode layer 14 made of a noble metal containing titanium or titanium oxide is provided on the adhesive layer 12, and an orientation control layer 15 that is preferentially oriented along a (100) or (001) plane is provided on the first electrode layer 14. In the vicinity of a surface of the orientation control layer 15 that is closer to the first electrode layer 14, a (100)- or (001)-oriented region extends over titanium or titanium oxide located on one surface of the first electrode layer 14 that is closer to the orientation control layer 15, and the cross-sectional area of the region in the direction perpendicular to the thickness direction gradually increases in the direction away from the first electrode layer 14 toward the opposite side. Further, a piezoelectric layer 16 that is preferentially oriented along a (001) plane is provided on the orientation control layer 15.

8 Claims, 17 Drawing Sheets

U.S. PATENT DOCUMENTS

| | | | |
|---|---|---|---|
| 6,097,133 | A | 8/2000 | Shimada et al. |
| 6,142,615 | A | 11/2000 | Qiu et al. |
| 6,194,818 | B1 | 2/2001 | Sumi et al. |
| 6,494,567 | B2 | 12/2002 | Murai |
| 6,969,157 | B2 * | 11/2005 | Tomozawa et al. ............ 347/68 |

FOREIGN PATENT DOCUMENTS

| | | | |
|---|---|---|---|
| JP | 2-238672 | A | 9/1990 |
| JP | 4-206871 | A | 7/1992 |
| JP | 06116095 | A | 4/1994 |
| JP | 06290983 | A | 10/1994 |
| JP | 06326270 | A | 11/1994 |
| JP | 07003431 | A | 1/1995 |
| JP | 07172984 | A | 7/1995 |
| JP | 8-222711 | A | 8/1996 |
| JP | 09223779 | A | 8/1997 |
| JP | 9-239891 | A | 9/1997 |
| JP | 10081016 | A | 3/1998 |
| JP | 10209517 | A | 8/1998 |
| JP | 11191646 | A | 7/1999 |
| JP | 2000-208715 | A | 7/2000 |
| JP | 2000252544 | A | 9/2000 |
| JP | 2000-285626 | A | 10/2000 |
| JP | 2001088294 | A | 4/2001 |
| JP | 2001-298220 | A | 10/2001 |
| JP | 2001332041 | A | 11/2001 |
| JP | 2003-46160 | A | 2/2003 |

OTHER PUBLICATIONS

Muralt, et al., "Texture control of PbTiO3 and Pb(Zr,Ti) O3 thin films with TiO2 seeding", Journal of Applied Physics, vol. 83, No. 7, pp. 3835-3841, Apr. 1, 1998.

Cattan, et al., "Structure control of Pb(Zr,Ti)O3 films using PbTiO3 buffer layers produced by magnetron sputtering", Journal of Applied Physics, vol. 70, No. 13, pp. 1718-1720, Mar. 31, 1997.

Ishikawa, et al., "Effect of PbTiO3 seeding layer on the growth of Sol-Gel-Derived Pb(Zr0.53 Ti0.47)O3 thin film", Journal of Applied Physics, Part 1, vol. 37, No. 9B, pp. 5128-5131, Sep. 30, 1998.

Kanno, et al., "Characterization of Pb(Zr,Ti)O3 thin films prepared by Multi-Ion-Beam sputtering", Journal of Applied Physics, Part 1, vol. 33, No. 1B, pp. 574-577, Jan. 1994.

Callister, William D.; "Introduction to Material Science and Engineering Fourth Edition"; John Wiley & Sons, Inc., 1999; pp. 39-41; TA403.C23.

* cited by examiner (a)
120
121
103
104
110
112
111
113
(b)
101
102a
102b
130
A
(c)
114
101
102a
102b
130
A (a)
(b)
A
103
104
110
112
111
113
120
121
101
102
102a
102b
114

(a)
(b)
A
103
104
110
112
111
114
113
101
102a
102b (a)
(b)
101
102a
102b
103
104
110
111
112
113
114

(a)
106
C
107
105
107
D
108
108
(b)
106
107
C
109
D
105
108
(c)
110
104
103
B
112
111
113
114
A
102
102
102a
C
D
105
108
107
(d)
110
104
103
B
112
111
113
114
A
102
102
C
D
108

(a)

(b)

(a)

(b)

(c)

(d)

(e)

(f)

PIEZOELECTRIC ELEMENT, INK JET HEAD, ANGULAR VELOCITY SENSOR, METHOD FOR MANUFACTURING THE SAME, AND INK JET RECORDING APPARATUS

CROSS-REFERENCE TO RELATED APPLICATIONS

This application is a divisional of U.S. patent application Ser. No. 10/472,589 filed on Sep. 18, 2003, now U.S. Pat. No. 7,033,001 issued on Apr. 25, 2006. U.S. patent application Ser. No. 10/472,589 is a National Phase of International Application No. PCT/JP02/13040 filed Dec. 12, 2002. This application also claims the benefit of Japanese Patent Application Nos. 2001-384313 and 2001-384314 both filed Dec. 18, 2001 and 2002-138793 filed May 14, 2002. The disclosure(s) of the above application(s) are incorporated herein by reference.

TECHNICAL FIELD

The present invention relates to a piezoelectric element having an electro-mechanical conversion function, an ink jet head using the piezoelectric element, an angular sensor, a method for manufacturing the same, and an ink jet recording apparatus including the ink jet head as printing means.

BACKGROUND ART

Generally, a piezoelectric material is a material capable of converting a mechanical energy to an electrical energy and vice versa. A typical example of a piezoelectric material is lead zirconate titanate having a perovskite crystalline structure ($Pb(Zr,Ti)O_3$) (hereinafter referred to as "PZT"). In PZT, the greatest piezoelectric displacement is obtained in the <001> direction (the c axis direction) in the case of a tetragonal system, and in the <111> direction in the case of a rhombohedral system. However, many of the piezoelectric materials are polycrystals made up of a collection of crystal grains, and the crystallographic axes of the crystal grains are oriented randomly. Therefore, the spontaneous polarizations Ps are also arranged randomly.

Along with the recent downsizing of electronic appliances, there is a strong demand for reducing the size of piezoelectric elements using a piezoelectric material. In order to meet the demand, more piezoelectric elements are already used in the form of thin films whose volumes can be significantly reduced from those of sinters, which have conventionally been used in various applications, and active researches and developments have been made for reducing the thickness of thin-film piezoelectric elements. For example, in the case of tetragonal PZT, the spontaneous polarization Ps is oriented in the c axis direction. Therefore, in order to realize superior piezoelectric characteristics even with a reduced thickness, the c axes of crystal grains forming a PZT thin film need to be aligned vertical to the substrate plane. In order to realize such an alignment, a sputtering method has been used in the prior art. Specifically, on a single crystal substrate made of magnesium oxide (MgO) having an NaCl-type crystalline structure, which has been cut out so that the surface thereof is along the crystal orientation of the (100) plane, a (100)-oriented Pt electrode thin film is formed as a lower electrode on the substrate, and a PZT thin film whose c axis is oriented vertical to the surface of the Pt electrode is formed on the Pt electrode at a temperature of 600 to 700° C. (see, for example, Journal of Applied Physics vol. 65 No. 4 (published on 15 Feb. 1989 from the American Physical Society) pp. 1666-1670, and Japanese Unexamined Patent Publication No. 10-209517). In such a case, if a piezoelectric element layer having a thickness of 0.1 μm and made of $PbTiO_3$ or $(Pb,La)TiO_3$, free of Zr, is formed as a base layer for a PZT thin film on the (100)-oriented Pt electrode before the formation of a PZT thin film, and then a PZT thin film having a thickness of 2.5 μm is formed on the piezoelectric element layer by a sputtering method, it is less likely that a layer of a low crystallinity made of a Zr oxide is formed early in the formation of the PZT thin film, thereby obtaining a PZT thin film having a higher crystallinity. Specifically, a PZT thin film whose degree of (001) orientation ("α(001)") is about 100% is obtained.

Herein, α(001) is defined as follows:

$$\alpha(001)=I(001)/\Sigma I(hkl)$$

ΣI(hkl) is the sum of diffraction peak intensities from various crystal planes of PZT having a perovskite crystalline structure for a Cu—Kα 2θ range of 10° to 70° in an X-ray diffraction method. Note that the (002) plane and the (200) plane are not included in ΣI(hkl) as they are equivalent to the (001) plane and (100) plane.

However, this method uses an MgO single crystal substrate as a base substrate, thereby increasing the cost of a piezoelectric element, and thus the cost of an ink jet head using the piezoelectric element. Moreover, another drawback is that the variety of the substrate material is limited to the MgO single crystal.

In view of this, various methods have been developed for forming a (001)- or (100)-oriented film of a perovskite piezoelectric material such as PZT on an inexpensive substrate such as a silicon substrate. For example, Japanese Patent Publication No. 3021930 discloses that a PZT film that is preferentially oriented along the (100) plane can be produced by applying a precursor solution of PZT or lanthanum-containing PZT on a (111)-oriented Pt electrode, performing a thermal decomposition process at 450 to 550° C. before the precursor solution is crystallized and then heating and crystallizing the precursor solution at 550 to 800° C. (a sol-gel method).

Moreover, Japanese Unexamined Patent Publication No. 2001-88294 discloses that by forming a very thin titanium layer on an iridium lower electrode, it is possible to control the crystal orientation of a PZT film to be formed thereon. This manufacturing method includes: forming a base layer whose main component is zirconium oxide on a substrate made of silicon, or the like; forming a lower electrode containing iridium on the base layer; depositing a very thin titanium layer on the lower electrode; forming an amorphous piezoelectric precursor thin film containing metal element and oxygen element, which forms a ferroelectric having piezoelectric characteristics, on the titanium layer; and heating and crystallizing the amorphous thin film at a high temperature (a sol-gel method), thereby turning the amorphous thin film into a perovskite piezoelectric thin film. With this manufacturing method, the crystal orientation of the piezoelectric thin film such as PZT can be controlled by the thickness of the titanium layer, and a (100)-oriented film is obtained when the thickness of the titanium layer is set to be 2 to 10 nm.

Furthermore, Japanese Unexamined Patent Publication No. 11-191646 discloses that where a piezoelectric thin film is formed by using a sol-gel method, a (100)-oriented PZT film can be obtained by forming a titanium layer having a thickness of 4 to 6 nm on a (111)-oriented Pt electrode and using titanium oxide, which is formed through oxidization of titanium in the titanium layer, as a nucleus.

However, while the methods described above are desirable methods that do not use an expensive MgO single-crystal substrate, it is difficult to obtain a well-oriented film having a desirable crystallinity in the film formation process, as in the case of forming a piezoelectric thin film on an MgO single-crystal substrate, because the piezoelectric thin film is formed by a sol-gel method. In view of this, an amorphous piezoelectric thin film is first formed, and then the layered structure including the substrate and the piezoelectric thin film is subjected to a heat treatment, so that the crystallographic axes are preferentially oriented in a desirable direction.

Moreover, when piezoelectric elements are mass-produced with a sol-gel method, the amorphous piezoelectric precursor thin film is likely to be cracked due to changes in the volume during the degreasing step of removing organic substances. Furthermore, in the step of heating and crystallizing the amorphous piezoelectric precursor thin film at a high temperature, the film is likely to be cracked or peeled off from the lower electrode due to crystal changes.

As a solution to these problems with a sol-gel method, Japanese Unexamined Patent Publication Nos. 2000-252544 and 10-81016 disclose that it is effective to add titanium or titanium oxide in the lower electrode. Particularly, Japanese Unexamined Patent Publication No. 10-81016 shows that a (100)-oriented PZT film can be obtained even with a sputtering method. Note however that a perovskite PZT film is not obtained directly on the lower electrode. First, a PZT film having an amorphous or pyrochlore crystalline structure is formed at a low temperature of 200° C. or less, which is then crystallized through a heat treatment at a high temperature of 500 to 700° C. in an oxygen atmosphere. Therefore, as with a sol-gel method, the film is likely to be cracked or peeled off from the lower electrode due to crystal changes in the step of heating and crystallizing the film at a high temperature. Moreover, the degree of (001) orientation or the degree of (100) orientation of the PZT film formed by a sol-gel method or a sputtering method as described above is 85% or less with either method.

Furthermore, with a sol-gel method, the maximum thickness of the PZT film to be formed in a single iteration of the step (including the application of the precursor solution and the following heat treatment) is about 100 nm at maximum. Therefore, in order to obtain a thickness of 1 μm or more, which is required for a piezoelectric element, it is necessary to repeat this step ten times or more, whereby the production yield may be reduced.

On the other hand, according to Japanese Unexamined Patent Publication No. 2001-88294, supra, states that attempts were made to control the orientation of PZT on an Ir base electrode with a very thin titanium layer formed thereon by using a method other than a sol-gel method (including an MOD method) (in which an amorphous thin film is once formed and then the thin film is turned into a crystalline thin film through an aftertreatment such as a heat treatment), i.e., by using a method in which a crystalline thin film is directly formed without the crystallization step using a heat treatment, e.g., a sputtering method, a laser ablation method or a CVD method, and that a well-oriented film was not obtained with any method other than a sol-gel method. The reason is stated to be as follows. The crystallization of the PZT film proceeds gradually from the lower electrode side to the upper electrode side with a sol-gel method, whereas with a CVD method or a sputtering method, the crystallization of the PZT film proceeds randomly, resulting in irregular crystallization, and thus making the orientation control difficult.

Moreover, when a titanium oxide film whose thickness is 12 nm or less is formed on a (111)-oriented Pt electrode layer, and a lead titanate film or a PZT film having a perovskite crystalline structure is formed directly by a sputtering method, either film exhibits a (111) orientation property, and a (100)- or (001)-oriented film is not obtained (see Journal of Applied Physics vol. 83 No. 7 (published on 1 Apr. 1998 from the American Physical Society) pp. 3835-3841).

The present invention has been made in view of the above, and has an object to provide a reliable piezoelectric element with desirable piezoelectric characteristics at low cost.

DISCLOSURE OF INVENTION

In order to achieve the object set forth above, according to the present invention, an electrode layer is made of a noble metal containing titanium or titanium oxide, an orientation control layer is formed on the electrode layer, and a piezoelectric layer is formed on the orientation control layer. In the formation of the orientation control layer, titanium or titanium oxide located on a surface of the electrode layer that is closer to the orientation control layer is used as a nucleus to perform crystal growth over the titanium or titanium oxide, such that the orientation control layer is preferentially oriented along the (100) or (001) plane, and the piezoelectric layer is preferentially oriented along the (001) plane by the orientation control layer.

Specifically, the 1st invention is directed to a piezoelectric element including a first electrode layer provided on a substrate, an orientation control layer provided on the first electrode layer, a piezoelectric layer provided on the orientation control layer, and a second electrode layer provided on the piezoelectric layer.

The first electrode layer is made of a noble metal containing titanium or titanium oxide. The orientation control layer is made of a cubic or tetragonal perovskite oxide that is preferentially oriented along a (100) or (001) plane. The piezoelectric layer is made of a rhombohedral or tetragonal perovskite oxide that is preferentially oriented along a (001) plane. In the vicinity of one surface of the orientation control layer that is closer to the first electrode layer, a (100)- or (001)-oriented region extends over titanium or titanium oxide located on one surface of the first electrode layer that is closer to the orientation control layer, and the cross-sectional area of the (100)- or (001)-oriented region in the direction perpendicular to the thickness direction gradually increases in the direction away from the first electrode layer toward the piezoelectric layer.

In the above structure, titanium or titanium oxide is added to the noble metal film which is employed as the first electrode layer, whereby the adhesion between the substrate and the first electrode layer is improved, and peeling off during the manufacture of the piezoelectric element is prevented. Further, in the case where the orientation control layer is formed on the first electrode layer by a sputtering method, the orientation control layer is likely to be oriented along the (100) or (001) plane (the (100) plane and the (001) plane are the same in a cubic system) even if the first electrode layer is oriented along the (111) plane. Titanium or titanium oxide exists in a dotted pattern on one surface of the first electrode layer, and the titanium or titanium oxide is used as a nucleus to grow the orientation control layer over the titanium or titanium oxide. Thus, the orientation control layer is likely to be oriented along the (100) or (001) plane over the titanium or titanium oxide. Furthermore, since the titanium or titanium oxide is contained in the first electrode layer, the titanium or titanium oxide hardly protrudes above the surface of the first electrode layer (even if it protrudes, the amount of protrusion is smaller than 2 nm). Also for such a reason, the orientation control layer is likely to be oriented along the (100) or (001)

plane. On the other hand, the first electrode layer is normally oriented along the (111) plane when a silicon substrate, or the like, is used. Therefore, a region of the orientation control layer above a portion of the surface of the first electrode layer where none of titanium and titanium oxide exist may be oriented in a direction other than along the (100) or (001) plane (e.g., along the (111) plane) or may be amorphous. However, such a region that is not oriented along the (100) or (001) plane extends only in the vicinity of the surface of the orientation control layer that is closer to the first electrode layer (i.e., within a distance of about 20 nm at maximum from the surface). Therefore, a (100)- or (001)-oriented region which extends over titanium or titanium oxide expands as the crystal growth process proceeds, and the cross-sectional area of the (100)- or (001)-oriented region in the direction perpendicular to the thickness direction gradually increases in the direction away from the first electrode layer toward the opposite side (the piezoelectric layer), while the region that is not oriented along the (100) or (001) plane gradually shrinks. When the thickness of the orientation control layer is about 20 nm, the (100)- or (001)-oriented region extends substantially across the entire surface. In the case where the piezoelectric layer is formed on the thus-formed orientation control layer, the piezoelectric layer is oriented by the orientation control layer along the (001) plane (including the (100) plane in a rhombohedral system because the (100) plane and the (001) plane are the same in a rhombohedral system). When such an orientation control layer is provided, a material which can further improve the crystallinity and orientation property can be used for the orientation control layer, while a piezoelectric material having desirable piezoelectric characteristics is used for the piezoelectric layer. As a result, the degree of (001) orientation of the piezoelectric layer can be set to 90% or more. It should be noted that, in the orientation control layer, the region that is not oriented along the (100) or (001) plane may exist not only in the vicinity of the surface of the orientation control layer that is closer to the first electrode layer but also on a surface of the orientation control layer that is closer to the piezoelectric layer. Even in such a case, the (100)- or (001)-oriented region extends substantially across the entire surface of the orientation control layer that is close to the piezoelectric layer so long as the thickness of the orientation control layer is 0.01 μm or more, and as a result, the degree of (001) orientation of the piezoelectric layer is 90% or higher.

Therefore, even with a deposition method, other than a sol-gel method, in which a crystalline thin film is directly formed on an inexpensive substrate such as a silicon substrate without the crystallization step using a heat treatment (e.g., a sputtering method or a CVD method), it is possible to obtain a piezoelectric layer with a desirable orientation, whereby it is possible to suppress the deviation in the piezoelectric characteristics of the piezoelectric element and to improve the reliability thereof. As the piezoelectric element is used while applying an electric field in the direction vertical to the surface of the piezoelectric layer thereof, the (001) orientation is advantageous, particularly with a tetragonal perovskite PZT film, because the direction of the electric field is then parallel to the <001> polarization axis direction, thus resulting in an increased piezoelectric effect. Moreover, since the polarization rotation due to the application of an electric field does not occur, it is possible to suppress the deviation in the piezoelectric characteristics of the piezoelectric element and to improve the reliability thereof. On the other hand, with a rhombohedral perovskite PZT film, since the polarization axis extends in the <111> direction, the (100) orientation results in an angle of about 54° between the direction of the electric field and the direction of the polarization axis. Nevertheless, by improving the (100) orientation property, the polarization can keep a constant angle with respect to the electric field application. Therefore, also in this case, the polarization rotation due to the electric field application does not occur, whereby it is possible to suppress the deviation in the piezoelectric characteristics of the piezoelectric element and to improve the reliability thereof (for example, in a non-oriented PZT film, the polarization axes are oriented in various directions, and application of an electric field urges the polarization axes to be aligned parallel to the electric field, whereby the piezoelectric characteristics may become voltage dependent and vary significantly, or a sufficient reliability may not be maintained due to aging).

Moreover, a piezoelectric layer having a desirable orientation is easily obtained without using an expensive MgO single-crystal substrate. Therefore, it is possible to reduce the manufacturing cost by using an inexpensive substrate, such as a glass substrate, a metal substrate, a ceramic substrate or an Si substrate.

Furthermore, even if the thickness of the piezoelectric layer is 1 μm or more, it is not necessary to repeat the same step a number of times, as with a sol-gel method, and the piezoelectric layer can be formed easily by a sputtering method, or the like. Thus, it is possible to suppress a decrease in the production yield.

According to the 2nd invention, in the 1st invention, the orientation control layer is made of lead lanthanum zirconate titanate whose zirconium content is equal to or greater than zero and less than or equal to 20 mol % and whose lead content is in excess of the stoichiometric composition by an amount greater than zero and less than or equal to 30 mol %, or made of the lead lanthanum zirconate titanate to which at least one of magnesium and manganese is added.

By using such a lead lanthanum zirconate titanate material (PLZT; including the composition where the zirconium content is zero, i.e., lead lanthanum titanate (PLT)) for the orientation control layer, the orientation control layer is even more likely to be oriented along the (100) or (001) plane, whereby it is possible to improve the orientation of the piezoelectric layer. In addition, by setting the zirconium content to be less than or equal to 20 mol %, it is less likely that a layer of a low crystallinity made of a Zr oxide is formed early in the crystal growth process. Furthermore, by setting the lead content to be in excess of the stoichiometric composition by an amount greater than zero and less than or equal to 30 mol %, a decrease in the crystallinity of the orientation control layer is reliably suppressed, whereby the breakdown voltage is increased. Therefore, it is possible to reliably improve the crystallinity or the orientation of the piezoelectric layer, and to further improve the piezoelectric characteristics of the piezoelectric element.

According to the 3rd invention, in the 2nd invention, the lanthanum content of the lead lanthanum zirconate titanate is greater than zero and less than or equal to 25 mol %.

According to the 4th invention, in the 2nd invention, when at least one of magnesium and manganese is added to the lead lanthanum zirconate titanate, the total amount thereof to be added is greater than zero and less than or equal to 10 mol %.

With the 3rd and 4th inventions, a decrease in the crystallinity of the orientation control layer is more efficiently suppressed.

According to the 5th invention, in the 1st invention, the first electrode layer is made of at least one noble metal selected from the group consisting of platinum, iridium, palladium and ruthenium, and the content of the titanium or titanium oxide which is contained in the noble metal is greater than zero and less than or equal to 30 mol %.

With such features, the first electrode layer sufficiently endure the temperatures selected for forming the respective films of the piezoelectric element by a sputtering method, or the like, and such a material of the first electrode layer is appropriate for use in the electrode. Further, the content of titanium or titanium oxide is preferably set to 30 mol % or less because, if it is higher than 30 mol %, the crystallinity and orientation property of the orientation control layer (and hence the crystallinity and orientation property of the piezoelectric layer) are deteriorated.

According to the 6th invention, in the 1st invention, titanium or titanium oxide existing at a surface of the first electrode layer that is closer to the orientation control layer protrudes less than 2 nm from the surface.

The titanium or titanium oxide is intended to be contained in the first electrode layer, but is not intended to be provided above the surface of the first electrode layer. Thus, the titanium or titanium oxide hardly protrudes above the surface of the first electrode layer that is closer to the orientation control layer. Even if it protrudes, the amount of protrusion is smaller than 2 nm. Therefore, as described above, the orientation control layer is likely to be oriented along the (100) or (001) plane.

According to the 7th invention, in the 1st invention, the piezoelectric layer is made of a piezoelectric material whose main component is lead zirconate titanate.

With such a feature, the piezoelectric material has desirable piezoelectric characteristics, and a piezoelectric element of high performance can be obtained.

According to the 8th invention, in the 1st invention, an adhesive layer for improving adhesion between the substrate and the first electrode layer is provided between the substrate and the first electrode layer.

With such a feature, the adhesion between the substrate and the first electrode layer is further improved, and accordingly, peeling off during the manufacture of the piezoelectric element is surely prevented.

The 9th invention is directed to an ink jet head comprising: a piezoelectric element in which a first electrode layer, an orientation control layer, a piezoelectric layer and a second electrode layer are layered in this order; a vibration layer provided on one surface of the piezoelectric element that is closer to the second electrode layer; and a pressure chamber member bonded to one surface of the vibration layer that is away from the piezoelectric element and including a pressure chamber for storing ink therein, in which the vibration layer is displaced in a thickness direction by a piezoelectric effect of the piezoelectric layer of the piezoelectric element so as to discharge the ink out of the pressure chamber.

In this invention, the first electrode layer of the piezoelectric element is made of a noble metal containing titanium or titanium oxide. The orientation control layer is made of a cubic or tetragonal perovskite oxide that is preferentially oriented along a (100) or (001) plane. The piezoelectric layer is made of a rhombohedral or tetragonal perovskite oxide that is preferentially oriented along a (001) plane. In the vicinity of one surface of the orientation control layer that is closer to the first electrode layer, a (100)- or (001)-oriented region extends over titanium or titanium oxide located on one surface of the first electrode layer that is closer to the orientation control layer, and the cross-sectional area of the (100)- or (001)-oriented region in the direction perpendicular to the thickness direction gradually increases in the direction away from the first electrode layer toward the piezoelectric layer.

According to this invention, the first electrode layer, the orientation control layer, the piezoelectric layer, the second electrode layer, and the vibration layer are formed in this order on a substrate by a sputtering method, or the like. The pressure chamber member is then bonded to the vibration layer, and thereafter, the substrate is removed. As a result, an ink jet head including a piezoelectric element which has a similar structure to that of the 1st invention is obtained, with the degree of (001) orientation of the piezoelectric layer being 90% or more. Thus, an ink jet head having a desirable durability with a small deviation in the ink-discharge performance is obtained.

The 10th invention is directed to an ink jet head comprising: a piezoelectric element in which a first electrode layer, an orientation control layer, a piezoelectric layer and a second electrode layer are layered in this order; a vibration layer provided on one surface of the piezoelectric element that is closer to the first electrode layer; and a pressure chamber member bonded to one surface of the vibration layer that is away from the piezoelectric element and including a pressure chamber for storing ink therein, in which the vibration layer is displaced in a thickness direction by a piezoelectric effect of the piezoelectric layer of the piezoelectric element so as to discharge the ink out of the pressure chamber.

The first electrode layer of the piezoelectric element is made of a noble metal containing titanium or titanium oxide. The orientation control layer is made of a cubic or tetragonal perovskite oxide that is preferentially oriented along a (100) or (001) plane. The piezoelectric layer is made of a rhombohedral or tetragonal perovskite oxide that is preferentially oriented along a (001) plane. In the vicinity of one surface of the orientation control layer that is closer to the first electrode layer, a (100)- or (001)-oriented region extends over titanium or titanium oxide located on one surface of the first electrode layer that is closer to the orientation control layer, and the cross-sectional area of the (100)- or (001)-oriented region in the direction perpendicular to the thickness direction gradually increases in the direction away from the first electrode layer toward the piezoelectric layer.

According to this invention, the pressure chamber member is used as a substrate, and the vibration layer, the first electrode layer, the orientation control layer, the piezoelectric layer and the second electrode layer are formed on the pressure chamber member in this order by a sputtering method, or the like, whereby an ink jet head having similar effects to those of the 9th invention is obtained.

The 11th invention is directed to an angular velocity sensor which comprises a substrate including a fixed portion and at least a pair of vibrating portions extending from the fixed portion in a predetermined direction, in which a first electrode layer, an orientation control layer, a piezoelectric layer and a second electrode layer are layered in this order at least on each of the vibrating portions of the substrate, and the second electrode layer on each of the vibrating portions is patterned into at least one driving electrode for vibrating the vibrating portion in a width direction thereof and at least one detection electrode for detecting a displacement of the vibrating portion in a thickness direction thereof.

The first electrode layer is made of a noble metal containing titanium or titanium oxide. The orientation control layer is made of a cubic or tetragonal perovskite oxide that is preferentially oriented along a (100) or (001) plane. The piezoelectric layer is made of a rhombohedral or tetragonal perovskite oxide that is preferentially oriented along a (001) plane. In the vicinity of one surface of the orientation control layer that is closer to the first electrode layer, a (100)- or (001)-oriented region extends over titanium or titanium oxide located on one surface of the first electrode layer that is closer to the orientation control layer, and the cross-sectional area of the (100)- or (001)-oriented region in the direction perpendicular to the thickness direction gradually increases in the direction away from the first electrode layer toward the piezoelectric layer.

According to this invention, each vibrating portion of the substrate is vibrated in the width direction thereof by applying a voltage between the driving electrode of the second electrode layer and the first electrode layer. When the vibrating portion deforms in the thickness direction due to the Coriolis force while it is being vibrated, a voltage is generated between the detection electrode of the second electrode layer and the first electrode layer, whereby the angular velocity can be calculated based on the magnitude of the voltage (the Coriolis force). The portion for detecting the angular velocity (the vibrating portion) is a piezoelectric element having a structure similar to that of the 1st invention. Therefore, the piezoelectric constant can be increased to be about 40 times as large as that of a conventional angular velocity sensor using quartz, and thus the size thereof can be reduced significantly. Moreover, even if the angular velocity sensors are mass-produced industrially, it is possible to obtain angular velocity sensors with a high characteristics reproducibility and a small characteristics deviation, and with a high breakdown voltage and a high reliability.

According to the 12th invention, in the 11th invention, the orientation control layer is made of lead lanthanum zirconate titanate whose zirconium content is equal to or greater than zero and less than or equal to 20 mol % and whose lead content is in excess of the stoichiometric composition by an amount greater than zero and less than or equal to 30 mol %, or made of the lead lanthanum zirconate titanate to which at least one of magnesium and manganese is added. With this feature, the same effects as those of the 2nd invention are obtained.

According to the 13th invention, in the 12th invention, the lanthanum content of the lead lanthanum zirconate titanate is greater than zero and less than or equal to 25 mol %. With this feature, the same effects as those of the 3rd invention are obtained.

According to the 14th invention, in the 12th invention, when at least one of magnesium and manganese is added to the lead lanthanum zirconate titanate, the total amount thereof to be added is greater than zero and less than or equal to 10 mol %. With this feature, the same effects as those of the 4th invention are obtained.

According to the 15th invention, in the 11th invention, the first electrode layer is made of at least one noble metal selected from the group consisting of platinum, iridium, palladium and ruthenium, and the content of the titanium or titanium oxide which is contained in the noble metal is greater than zero and less than or equal to 30 mol %. With this feature, the same effects as those of the 5th invention are obtained.

According to the 16th invention, in the 11th invention, titanium or titanium oxide existing at a surface of the first electrode layer that is closer to the orientation control layer protrudes less than 2 nm from the surface. With this feature, the same effects as those of the 6th invention are obtained.

According to the 17th invention, in the 11th invention, the piezoelectric layer is made of a piezoelectric material whose main component is lead zirconate titanate. With this feature, the same effects as those of the 7th invention are obtained.

According to the 18th invention, in the 11th invention, an adhesive layer for improving adhesion between the substrate and the first electrode layer is provided between the substrate and the first electrode layer. With this feature, the same effects as those of the 8th invention are obtained.

The 19th invention is directed to a method for manufacturing a piezoelectric element, which comprises the steps of: forming a first electrode layer made of a noble metal containing titanium or titanium oxide on a substrate by a sputtering method; forming an orientation control layer made of a cubic or tetragonal perovskite oxide on the first electrode layer by a sputtering method; forming a piezoelectric layer made of a rhombohedral or tetragonal perovskite oxide on the orientation control layer by a sputtering method; and forming a second electrode layer on the piezoelectric layer.

In this invention, the step of forming the orientation control layer includes a step of using titanium or titanium oxide which exists on one surface of the first electrode layer that is closer to the orientation control layer as a nucleus to perform crystal growth over the titanium or titanium oxide such that the orientation control layer is preferentially oriented along the (100) or (001) plane. The step of forming the piezoelectric layer includes a step of preferentially orienting the piezoelectric layer along the (001) plane by the orientation control layer.

With this invention, a piezoelectric element having the same effects as those of the 1st invention can readily be manufactured.

The 20th invention is directed to a method for manufacturing an ink jet head, the ink jet head including a piezoelectric element in which a first electrode layer, an orientation control layer, a piezoelectric layer and a second electrode layer are layered in this order, in which a vibration layer is displaced in a thickness direction by a piezoelectric effect of the piezoelectric layer of the piezoelectric element so as to discharge ink out of a pressure chamber.

The method of this invention includes the steps of: forming the first electrode layer made of a noble metal containing titanium or titanium oxide on a substrate by a sputtering method; forming the orientation control layer made of a cubic or tetragonal perovskite oxide on the first electrode layer by a sputtering method; forming the piezoelectric layer made of a rhombohedral or tetragonal perovskite oxide by a sputtering method; forming the second electrode layer on the piezoelectric layer; forming the vibration layer on the second electrode layer; bonding a pressure chamber member for forming the pressure chamber on one surface of the vibration layer that is away from the second electrode layer; and removing the substrate after the bonding step. The step of forming the orientation control layer includes a step of using titanium or titanium oxide which exists on one surface of the first electrode layer that is closer to the orientation control layer as a nucleus to perform crystal growth over the titanium or titanium oxide such that the orientation control layer is preferentially oriented along the (100) or (001) plane. The step of forming the piezoelectric layer includes a step of preferentially orienting the piezoelectric layer along the (001) plane by the orientation control layer.

With such features, an ink jet head having the same effects as those of the 9th invention can readily be manufactured.

The 21st invention is directed to a method for manufacturing an ink jet head, the ink jet head including a piezoelectric element in which a first electrode layer, an orientation control layer, a piezoelectric layer and a second electrode layer are layered in this order, in which a vibration layer is displaced in a thickness direction by a piezoelectric effect of the piezoelectric layer of the piezoelectric element so as to discharge ink out of a pressure chamber.

The method of this invention includes the steps of: forming the vibration layer on a pressure chamber substrate for forming the pressure chamber; forming the first electrode layer made of a noble metal containing titanium or titanium oxide on the vibration layer by a sputtering method; forming the orientation control layer made of a cubic or tetragonal perovskite oxide on the first electrode layer by a sputtering method; forming the piezoelectric layer made of a rhombohedral or tetragonal perovskite oxide by a sputtering method; forming the second electrode layer on the piezoelectric layer; and forming the pressure chamber in the pressure chamber substrate. The step of forming the orientation control layer includes a step of using titanium or titanium oxide which exists on one surface of the first electrode layer that is closer to the orientation control layer as a nucleus to perform crystal growth over the titanium or titanium oxide such that the orientation control layer is preferentially oriented along the (100) or (001) plane. The step of forming the piezoelectric layer includes a step of preferentially orienting the piezoelectric layer along the (001) plane by the orientation control layer.

With such features, an ink jet head having the same effects as those of the 10th invention can readily be manufactured.

The 22nd invention is directed to a method for manufacturing an angular velocity sensor, the angular velocity sensor comprising a substrate including a fixed portion and at least a pair of vibrating portions extending from the fixed portion in a predetermined direction, in which a first electrode layer, an orientation control layer, a piezoelectric layer and a second electrode layer are layered in this order at least on each of the vibrating portions of the substrate, and the second electrode layer on each of the vibrating portions is patterned into at least one driving electrode for vibrating the vibrating portion in a width direction thereof and at least one detection electrode for detecting a displacement of the vibrating portion in a thickness direction thereof.

The method of this invention includes the steps of: forming the first electrode layer made of a noble metal containing titanium or titanium oxide on a substrate by a sputtering method; forming the orientation control layer made of a cubic or tetragonal perovskite oxide on the first electrode layer by a sputtering method; forming the piezoelectric layer made of a rhombohedral or tetragonal perovskite oxide on the orientation control layer by a sputtering method; forming the second electrode layer on the piezoelectric layer; patterning the second electrode layer so as to form the driving electrode and the detection electrode; patterning the piezoelectric layer, the orientation control layer and the first electrode layer; and patterning the substrate so as to form the fixed portion and the vibrating portions. The step of forming the orientation control layer includes a step of using titanium or titanium oxide which exists on one surface of the first electrode layer that is closer to the orientation control layer as a nucleus to perform crystal growth over the titanium or titanium oxide such that the orientation control layer is preferentially oriented along the (100) or (001) plane. The step of forming the piezoelectric layer includes a step of preferentially orienting the piezoelectric layer along the (001) plane by the orientation control layer.

With such features, an angular velocity sensor having the same effects as those of the 11th invention can readily be manufactured.

The 23rd invention is directed to an ink jet recording apparatus comprising an ink jet head, the ink jet head including: a piezoelectric element in which a first electrode layer, an orientation control layer, a piezoelectric layer and a second electrode layer are layered in this order; a vibration layer provided on one surface of the piezoelectric element that is closer to the second electrode layer; and a pressure chamber member bonded to one surface of the vibration layer that is away from the piezoelectric element and including a pressure chamber for storing ink therein, the ink jet head being capable of being relatively moved with respect to a recording medium, in which while the ink jet head is moved with respect to the recording medium, the vibration layer is displaced in a thickness direction by a piezoelectric effect of the piezoelectric layer of the piezoelectric element in the ink jet head so as to discharge the ink out of the pressure chamber through a nozzle hole communicated to the pressure chamber onto the recording medium, thereby recording information.

In this invention, the first electrode layer of the piezoelectric element of the ink jet head is made of a noble metal containing titanium or titanium oxide. The orientation control layer is made of a cubic or tetragonal perovskite oxide that is preferentially oriented along a (100) or (001) plane. The piezoelectric layer is made of a rhombohedral or tetragonal perovskite oxide that is preferentially oriented along a (001) plane. In the vicinity of one surface of the orientation control layer that is closer to the first electrode layer, a (100)- or (001)-oriented region extends over titanium or titanium oxide located on one surface of the first electrode layer that is closer to the orientation control layer, and the cross-sectional area of the (100) or (001)-oriented region in the direction perpendicular to the thickness direction gradually increases in the direction away from the first electrode layer toward the piezoelectric layer.

The 24th invention is directed to an ink jet recording apparatus comprising an ink jet head, the ink jet head including: a piezoelectric element in which a first electrode layer, an orientation control layer, a piezoelectric layer and a second electrode layer are layered in this order; a vibration layer provided on one surface of the piezoelectric element that is closer to the first electrode layer; and a pressure chamber member bonded to one surface of the vibration layer that is away from the piezoelectric element and including a pressure chamber for storing ink therein, the ink jet head being capable of being relatively moved with respect to a recording medium, in which while the ink jet head is moved with respect to the recording medium, the vibration layer is displaced in a thickness direction by a piezoelectric effect of the piezoelectric layer of the piezoelectric element in the ink jet head so as to discharge the ink out of the pressure chamber through a nozzle hole communicated to the pressure chamber onto the recording medium, thereby recording information.

The first electrode layer of the piezoelectric element of the ink jet head is made of a noble metal containing titanium or titanium oxide. The orientation control layer is made of a cubic or tetragonal perovskite oxide that is preferentially oriented along a (100) or (001) plane. The piezoelectric layer is made of a rhombohedral or tetragonal perovskite oxide that is preferentially oriented along a (001) plane. In the vicinity of one surface of the orientation control layer that is closer to the first electrode layer, a (100)- or (001)-oriented region extends over titanium or titanium oxide located on one surface of the first electrode layer that is closer to the orientation control layer, and the cross-sectional area of the (100)- or (001)-oriented region in the direction perpendicular to the thickness direction gradually increases in the direction away from the first electrode layer toward the piezoelectric layer.

With the 23rd and 24th inventions, it is possible to easily obtain an ink jet recording apparatus that provides a quite desirable printing performance and durability.

BEST MODE FOR CARRYING OUT THE INVENTION

EMBODIMENT 1

Figure 1:
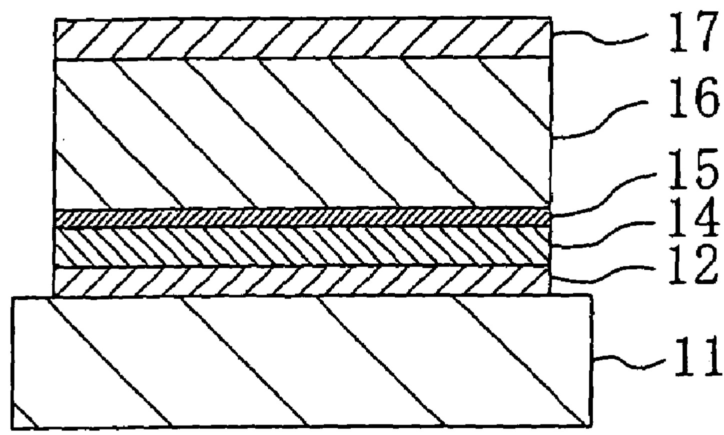
FIG. 1 is a cross-sectional view illustrating a piezoelectric element according to an embodiment of the present invention.

FIG. 1 illustrates a piezoelectric element according to an embodiment of the present invention. In the figure, the reference numeral 11 denotes a substrate made of a 4-inch silicon (Si) wafer having a thickness of 0.3 mm, and an adhesive layer 12 made of titanium (Ti) and having a thickness of 0.02 μm is formed on the substrate 11. Note that the substrate 11 is not limited to an Si substrate, but may alternatively be a glass substrate, a metal substrate, a ceramic substrate, or the like.

A first electrode layer 14 having a thickness of 0.22 μm and made of platinum (Pt) to which 2.1 mol % of Ti is added is formed on the adhesive layer 12. The first electrode layer 14 is oriented along the (111) plane.

An orientation control layer 15 made of PLT having a cubic or tetragonal perovskite crystalline structure whose lanthanum (La) content is 12 mol % and whose lead content is 8 mol % in excess of the stoichiometric composition is formed on the first electrode layer 14. The orientation control layer 15 is preferentially oriented along the (100) or (001) plane, and has a thickness of 0.03 μm.

A piezoelectric layer 16 having a thickness of 3 μm and made of PZT having a rhombohedral or tetragonal perovskite crystalline structure is formed on the orientation control layer 15. The piezoelectric layer 16 is preferentially oriented along the (001) plane. The Zr/Ti composition of the PZT material is 53/47, which is near the boundary between being tetragonal and being rhombohedral (i.e., the morphotropic phase boundary). Note that the Zr/Ti composition of the piezoelectric layer 16 is not limited to 53/47, but may be any other suitable composition as long as it is in the range of 30/70 to 70/30. Moreover, the material of the piezoelectric layer 16 is not limited to any particular material, as long as it is a piezoelectric material whose main component is PZT, e.g., those obtained by adding an additive such as Sr, Nb or Al to PZT. For example, PMN or PZN may be used. Furthermore, the thickness thereof is not limited to any particular thickness as long as it is in the range of 0.5 to 5.0 μm.

A second electrode layer 17 having a thickness of 0.2 μm and made of Pt is formed on the piezoelectric layer 16. Note that the material of the second electrode layer 17 is not limited to Pt as long as it is a conductive material, and the thickness thereof is not limited to any particular thickness as long as it is in the range of 0.1 to 0.4 μm.

The piezoelectric element is obtained by depositing the adhesive layer 12, the first electrode layer 14, the orientation control layer 15, the piezoelectric layer 16 and the second electrode layer 17 in this order on the substrate 11 by a sputtering method. Note that the deposition method is not limited to a sputtering method, but may alternatively be any other suitable deposition method as long as a crystalline thin film is directly formed without the crystallization step using a heat treatment (e.g., a CVD method). Moreover, the deposition method for the adhesive layer 12 and the second electrode layer 17 may be a sol-gel method, or the like.

The adhesive layer 12 is provided for improving the adhesion between the substrate 11 and the first electrode layer 14. The material of the adhesive layer 12 is not limited to Ti, but may alternatively be tantalum, iron, cobalt, nickel, chromium, or a compound thereof (including Ti). Moreover, the thickness thereof is not limited to any particular thickness as long as it is in the range of 0.005 to 1 μm. The adhesive layer 12 is not always necessary. Even if the first electrode layer 14 is formed directly on the substrate 11, the adhesion between the substrate 11 and the first electrode layer 14 is quite desirable because Ti is contained in the first electrode layer 14.

The first electrode layer 14 not only functions as an electrode, but also functions, with the addition of Ti, to preferentially orient the orientation control layer 15 along the (100) or (001) plane. Titanium oxide may be added in place of Ti. The amount of titanium or titanium oxide to be added is preferably greater than zero and less than or equal to 30 mol %. Moreover, the material of the first electrode layer 14 may be at least one noble metal selected from the group consisting of Pt, iridium, palladium and ruthenium, and the thickness thereof is not limited to any particular thickness as long as it is in the range of 0.05 to 2 μm. Titanium or titanium oxide existing at a surface of the first electrode layer 14 that is closer to the orientation control layer 15 is intended to be contained in the first electrode layer 14, but is not intended to be provided above the surface of the first electrode layer 14. Thus, the titanium or titanium oxide hardly protrudes above the surface of the first electrode layer 14 that is closer to the orientation control layer 15. Even if it protrudes, the amount of protrusion is smaller than 2 nm.

The orientation control layer 15 is provided for improving the crystallinity and the (001) orientation property of the piezoelectric layer 16. For this purpose, the orientation control layer 15 is made of PLT, which contains La and contains no Zr and whose lead content is in excess of the stoichiometric composition. Note that in order to improve the crystallinity and the orientation of the piezoelectric layer 16, the La content thereof may be greater than zero and less than or equal to 25 mol %, and the lead content thereof may be in excess of the stoichiometric composition by an amount greater than zero and less than or equal to 30 mol %. Moreover, the material of the orientation control layer 15 is not limited to PLT as described above, but may alternatively be PLZT obtained by adding zirconium to PLT, or may be a material obtained by adding at least one of magnesium and manganese to PLT or PLZT. The zirconium content is preferably less than or equal to 20 mol %, and when at least one of magnesium and manganese is added, the total amount thereof to be added is preferably greater than zero and less than or equal to 10 mol % (the amount of one of magnesium and manganese may be zero). The thickness of the orientation control layer 15 is not limited to any particular thickness as long as it is in the range of 0.01 to 0.2 μm.

Figure 2:
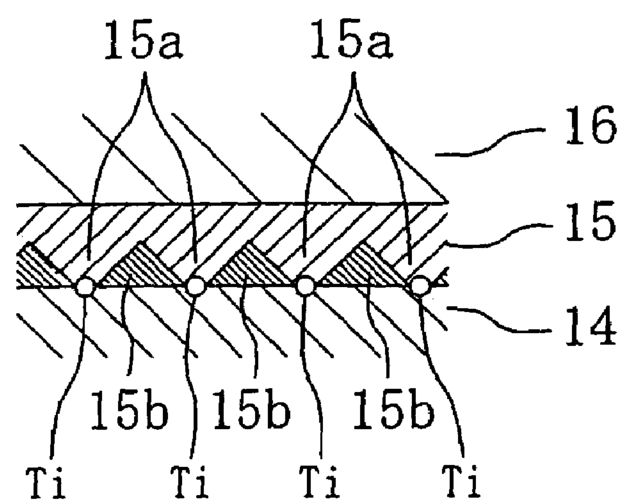
FIG. 2 is an enlarged cross-sectional view schematically illustrating the structure of an orientation control layer in the piezoelectric element.

In the vicinity of one surface of the orientation control layer 15 that is closer to the first electrode layer 14, a (100)- or (001)-oriented region 15*a* extends over titanium (exactly speaking, this is titanium oxide in the case where titanium oxide is contained in the first electrode layer 14, but even in the case where titanium is contained in the first electrode layer 14, this may sometimes be titanium oxide because of oxidation) located on one surface of the first electrode layer 14 that is closer to the orientation control layer 15, as illustrated in FIG. 2, so that the cross-sectional area of the region 15*a* in the direction perpendicular to the thickness direction gradually increases in the direction away from the first electrode layer 14 toward the piezoelectric layer 16. On the other hand, since the first electrode layer 14 is oriented along the (111) plane, each region 15*b* of the orientation control layer 15, which is located over a portion of the surface of the first electrode layer 14 where none of titanium and titanium oxide exist, is not oriented along the (100) or (001) plane, but is oriented along the (111) plane in the present embodiment (the region 15*b* may be oriented in a direction other than along the (111) plane or may be amorphous depending on the material of the first electrode layer 14). Such a region 15*b* that is not oriented along the (100) or (001) plane extends only within a distance of about 20 nm at maximum from the surface of the orientation control layer 15 that is closer to the first electrode layer 14. If the thickness of the orientation control layer 15 is 0.02 μm or more, the (100)- or (001)-oriented region 15*a* extends substantially across the entire surface of the orientation control layer 15 that is closer to the piezoelectric layer 16.

The piezoelectric layer 16 is preferentially oriented along the (001) plane by the orientation control layer 15, and the degree of (001) orientation, α, of the piezoelectric layer 16 is 90% or more.

Note that it is not necessary that the region 15*a* extends substantially across the entire surface of the orientation control layer 15 that is closer to the piezoelectric layer 16. The region 15*b* that is not oriented along the (100) or (001) plane may partially exist on that surface due to the fairly small thickness of the orientation control layer 15. However, even in such a case, if the thickness of the orientation control layer 15 is 0.01 μm or more, a (100)- or (001)-oriented region extends across a major portion of the surface of the orientation control layer 15 that is closer to the piezoelectric layer 16, with the degree of (001) orientation of the piezoelectric layer 16 being as high as 90% or more.

Next, a method for manufacturing a piezoelectric element as described above will be described.

The adhesive layer 12, the first electrode layer 14, the orientation control layer 15, the piezoelectric layer 16 and the second electrode layer 17 are deposited in this order on the Si substrate 11 by a sputtering method.

The adhesive layer 12 is obtained by using a Ti target and applying a high-frequency power of 100 W thereto for 1 minute while heating the substrate 11 to 400° C. in an argon gas at 1 Pa.

The first electrode layer 14 is obtained by using a Ti target and a Pt target and applying high-frequency powers of 85 W and 200 W thereto for 12 minutes while heating the substrate 11 to 400° C. in an argon gas at 1 Pa, using a multi-target sputtering apparatus. Titanium exists in a dotted pattern on one surface of the obtained first electrode layer 14 that is away from the adhesive layer 12.

The gas used for forming the first electrode layer 14 by the sputtering method may be only an argon gas as described above, or may be a mixed gas of argon and oxygen. In the case where the argon gas is solely used, titanium on the surfaces of the first electrode layer 14 is not oxidized. In the case where the mixed gas of argon and oxygen is used, the titanium is oxidized to become titanium oxide. In the case where the mixed gas of argon and oxygen is used, the temperature of the substrate 11 is desirably set to 650° C. or lower. This is because, if the temperature of the substrate 11 is higher than 650° C., not only titanium but also the surface of a noble metal is slightly oxidized, and accordingly, the crystallinity and the orientation of the orientation control layer 15 formed above the substrate 11 may be adversely influenced.

The orientation control layer 15 is obtained by using a sinter target prepared by adding a 12 mol % excess of lead oxide (PbO) to PLT containing 14 mol % of lanthanum and applying a high-frequency power of 300 W thereto for 12 minutes while heating the substrate 11 to 600° C. in a mixed atmosphere of argon and oxygen (gas volume ratio: $Ar:O_2=19:1$) at a degree of vacuum of 0.8 Pa.

The oxygen partial pressure in the mixed gas of argon and oxygen which is used for forming the orientation control layer 15 by the sputtering method is preferably greater than 0% and less than or equal to 10%. This is because the crystallinity of the orientation control layer 15 deteriorates in an environment where no oxygen exists. If the oxygen partial pressure is higher than 10%, the orientation of the (100) or (001) plane deteriorates. Further, the degree of vacuum is preferably 0.05 Pa or higher and 5 Pa or lower. This is because, if the degree of vacuum is lower than 0.05 Pa, the crystallinity of the orientation control layer 15 becomes non-uniform. If the degree of vacuum is higher than 5 Pa, the orientation of the (100) or (001) plane deteriorates.

When forming the orientation control layer 15 by the sputtering method, the temperature of the substrate 11 is desirably set to 450° C. or higher and 750° C. or lower. This is because, if the temperature of the substrate 11 is lower than 450° C., the crystallinity of the orientation control layer 15 deteriorates, and pyrochlore is more likely to be generated. If the temperature of the substrate 11 is 750° C. or higher, Pb contained in the film of the orientation control layer 15 evaporates during the formation of the film, so that the orientation control layer 15 lacks Pb. As a result, the crystallinity of the orientation control layer 15 deteriorates.

More preferably, the oxygen partial pressure is set to 0.5% or higher and 10% or lower, the degree of vacuum is set to 0.1 Pa or higher and 2 Pa or lower, and the temperature of the substrate 11 is 500° C. or higher and 650° C. or lower.

In the case of forming the orientation control layer 15 according to the above conditions, the orientation control layer 15 grows using titanium, which exists in a dotted pattern on one surface of the first electrode layer 14 that is closer to the orientation control layer 15, as a nucleus, whereby the orientation control layer 15 is likely to be oriented along the (100) or (001) plane over titanium. Since, as described above, the titanium hardly protrudes above the surface of the first electrode layer 14 (even if it protrudes, the amount of protrusion is smaller than 2 nm), the orientation control layer 15 is more likely to be oriented along the (100) or (001) plane. On the other hand, since the first electrode layer 14 is oriented along the (111) plane, regions of the orientation control layer 15 located over portions of the surface of the first electrode layer 14 where titanium does not exist are not oriented along the (100) or (001) plane (but is oriented along the (111) plane in the present embodiment). As the crystal growth process proceeds, these regions gradually shrink while the (100)- or (001)-oriented region gradually expands. As a result, in the vicinity of the first electrode layer 14, the orientation control layer 15 has the (100)- or (001)-oriented region 15*a* (over titanium located on one surface of the first electrode layer 14 that is closer to the orientation control layer 15) and the region 15*b* that is not oriented along the (100) or (001) plane (over portions of the surface of the first electrode layer 14 where titanium does not exist), as described above. The cross-sectional area of the (100)- or (001)-oriented region 15*a* increases in the direction away from the first electrode layer 14 toward the other side (i.e., toward the piezoelectric layer 16). At the surface of the orientation control layer 15 that is closer to the piezoelectric layer 16, the (100)- or (001)-oriented region 15*a* extends substantially across the entire surface of the orientation control layer 15. In the case where the zirconium content is set to 20 mol % or less, and the lanthanum content is set to greater than 0 and less than or equal to 25 mol %, the crystallinity and the orientation of the orientation control layer 15 are significantly improved. Especially as the zirconium content decreases, a layer of a low crystallinity made of a Zr oxide is less likely to be formed in the initial period of the crystal growth process. As a result, deterioration in the crystallinity is surely suppressed.

The piezoelectric layer 16 is obtained by using a sinter target of PZT (Zr/Ti=53/47) and applying a high-frequency power of 250 W thereto for 3 hours while heating the substrate 11 to 610° C. in a mixed atmosphere of argon and oxygen (gas volume ratio: $Ar:O_2=19:1$) at a degree of vacuum of 0.3 Pa.

The oxygen partial pressure in the mixed gas of argon and oxygen which is set for forming the piezoelectric layer 16 by the sputtering method is preferably greater than 0% and less than or equal to 30%. This is because the crystallinity of the piezoelectric layer 16 deteriorates in an environment where no oxygen exists. If the oxygen partial pressure is higher than 30%, the orientation of the (001) plane deteriorates. Further, the degree of vacuum is preferably 0.1 Pa or higher and 1 Pa or lower. This is because, if the degree of vacuum is lower than 0.1 Pa, the crystallinity and the piezoelectric characteristics of the piezoelectric layer 16 become non-uniform. If the degree of vacuum is higher than 1 Pa, the orientation of the (001) plane deteriorates.

The temperature of the substrate 11 which is selected for forming the piezoelectric layer 16 by the sputtering method is preferably 450° C. or higher and 750° C. or lower. This is because, if the temperature of the substrate 11 is lower than 450° C., the crystallinity of the piezoelectric layer 16 deteriorates, and pyrochlore is more likely to be generated. If the temperature of the substrate 11 is higher than 750° C., Pb contained in the film of the piezoelectric layer 16 evaporates during the formation of the film, so that the piezoelectric layer 16 lacks Pb. As a result, the crystallinity of the piezoelectric layer 16 deteriorates.

More preferably, the oxygen partial pressure is set to 1% or higher and 10% or lower, the degree of vacuum is set to 0.15 Pa or higher and 0.8 Pa or lower, and the temperature of the substrate 11 is 525° C. or higher and 625° C. or lower.

In the case of forming the piezoelectric layer 16 according to the above conditions, since the surface of the orientation control layer 15 that is closer to the piezoelectric layer 16 is oriented along the (100) or (001) plane, the piezoelectric layer 16 is oriented along the (001) plane (herein Zr/Ti=53/47, and thus the crystal is rhombohedral; since the (100) plane and the (001) plane are the same in a rhombohedral system, the rhombohedral (100) orientation is included herein), whereby the degree of (001) orientation thereof (the degree of (100) orientation of the rhombohedral system) is 90% or more. Moreover, since the orientation control layer 15 has a desirable crystallinity, the piezoelectric layer 16 also has a desirable crystallinity.

The second electrode layer 17 is obtained by using a Pt target and applying a high-frequency power of 200 W thereto for 10 minutes at a room temperature in an argon gas at 1 Pa.

Thus, in the piezoelectric element of the present embodiment, the piezoelectric layer 16 having a desirable crystallinity and a desirable orientation can be obtained by depositing it by a sputtering method on the inexpensive silicon substrate 11, without using an expensive MgO single-crystal substrate. Therefore, it is possible to suppress the deviation in the piezoelectric characteristics of the piezoelectric element and to improve the reliability thereof while reducing the manufacturing cost. Moreover, a layer of a low crystallinity made of a Zr oxide is less likely to be formed, whereby it is possible to increase the breakdown voltage of the piezoelectric element.

Next, specific examples of the present invention will be described. In each of Examples 1-5, a structure in which an adhesive layer, a first electrode layer, an orientation control layer, a piezoelectric layer, and a second electrode layer are formed on a substrate in this order (except that an adhesive layer is not formed in Example 5) is the same as that described in the above embodiment.

EXAMPLE 1

A piezoelectric element of Example 1 was produced by using the same material, thickness and manufacturing method for each film as those of the embodiment described above. No crack or peeling off was observed for any of the films of the piezoelectric element of Example 1.

The crystal orientation and the film composition of the piezoelectric layer before the formation of the second electrode layer were examined. Specifically, an analysis by an X-ray diffraction method showed that the piezoelectric layer had a (100)-oriented rhombohedral perovskite crystalline structure (degree of (100) orientation: $\alpha$=97%). Moreover, an analysis of the composition of the PZT film with an X-ray microanalyzer showed that the Zr/Ti ratio was 53/47 as in the target composition.

Then, the crystal orientation and the film composition of the first electrode layer before the formation of the orientation control layer were examined. Specifically, an analysis by an X-ray diffraction method showed that the Pt film was oriented along the (111) plane. Moreover, an analysis of the composition at a depth of 5 nm from the surface with X-ray photoelectron spectroscopy (XPS) showed that the Ti content was 2.1 mol %.

Then, the crystal orientation and the film composition of the orientation control layer before the formation of the piezoelectric layer were examined. The PLT film of the orientation control layer had a (100)-oriented perovskite crystalline structure. Note that a (111)-oriented region was observed on one side of the orientation control layer that is closer to the first electrode layer. It is believed that the (111)-oriented region exists over a portion of the surface of the first electrode layer where titanium does not exist. Moreover, a composition analysis with an X-ray microanalyzer showed that 12 mol % of lanthanum was contained, and an 8 mol % excess of Pb was contained.

Next, before the formation of the second electrode layer, 100 cantilevers having a size of 15 mm×2 mm were cut out by dicing. Then, the second electrode layer having a thickness of 0.2 μm was formed thereon by a sputtering method, and the piezoelectric constant d31 was measured (see, for example, Japanese Unexamined Patent Publication No. 2001-21052 for the method for measuring the piezoelectric constant d31). The average piezoelectric constant of the 100 cantilevers was −127 pC/N (deviation: $\sigma$=4.2%).

Then, the second electrode layer of the piezoelectric element was formed as 65 pieces of Pt film each having a size of 1 mm×1 mm and a thickness of 0.2 μm and arranged at an interval of 10 mm by a sputtering method using a metal mask. The breakdown voltage was measured by applying a voltage between each second electrode layer and the first electrode layer. Note that the breakdown voltage value was defined to be the value of the applied voltage for which the current value was 1 μA. As a result, the average breakdown voltage value was 118 V (deviation: $\sigma$=4.2%).

EXAMPLE 2

In Example 2, a 4-inch stainless steel (SUS304) having a thickness of 0.25 mm was used as the substrate, a tantalum (Ta) film having a thickness of 0.01 μm was used as the adhesive layer, a Pt film having a thickness of 0.25 μm and containing 8 mol % of titanium oxide was used as the first electrode layer, a PLT film (to which 3 mol % of magnesium was added) having a thickness of 0.03 μm and containing 17 mol % of lanthanum in which the lead content was 6 mol % in excess of the stoichiometric composition was used as the orientation control layer, a PZT film (Zr/Ti=40/60) having a thickness of 2.7 μm was used as the piezoelectric layer, and a Pt film having a thickness of 0.1 μm was used as the second electrode layer.

The adhesive layer was obtained by using a Ta target and applying a high-frequency power of 100 W thereto for 1 minute while heating the substrate to 500° C. in an argon gas at 1 Pa.

The first electrode layer was obtained by using a Ti target and a Pt target and applying high-frequency powers of 120 W and 200 W thereto, respectively, for 12 minutes while heating the substrate to 400° C. in a mixed atmosphere of argon and oxygen at 1 Pa (gas volume ratio: Ar:$O_2$=15:1), using a multi-target sputtering apparatus.

The orientation control layer was obtained by using a sinter target, which was prepared by adding 3 mol % of magnesium and a 10 mol % excess of lead oxide (PbO) to PLT containing 20 mol % of lanthanum, and applying a high-frequency power of 300 W thereto for 15 minutes at a substrate temperature of 600° C. in a mixed atmosphere of argon and oxygen (gas volume ratio: Ar:$O_2$=19:1) at a degree of vacuum of 0.8 Pa.

The piezoelectric layer was obtained by using a sinter target of PZT (Zr/Ti=40/60) and applying a high-frequency power of 250 W thereto for 3 hours at a substrate temperature of 600° C. in a mixed atmosphere of argon and oxygen (gas volume ratio: Ar:$O_2$=19:1) at a degree of vacuum of 0.3 Pa.

The second electrode layer was obtained by using a Pt target and applying a high-frequency power of 200 W thereto at a room temperature in an argon gas at 1 Pa.

Also in Example 2, no crack or peeling off was observed for any of the films of the piezoelectric element.

Then, the crystal orientation and the film composition of the piezoelectric layer before the formation of the second electrode layer were examined as in Example 1, indicating that the piezoelectric layer had a (001)-oriented tetragonal perovskite crystalline structure (degree of (001) orientation: $\alpha$=98%). Moreover, an examination of the composition of the PZT film showed that the Zr/Ti ratio was 40/60 as in the target composition.

Then, the crystal orientation and the film composition of the first electrode layer before the formation of the orientation control layer were examined, indicating that the Pt film was oriented along the (111) plane. Moreover, the titanium oxide content was 8 mol %.

Then, the crystal orientation and the film composition of the orientation control layer before the formation of the piezoelectric layer were examined, indicating that the PLT film had a (001)-oriented perovskite crystalline structure. Note that a (111)-oriented region was observed on one side of the orientation control layer that is closer to the first electrode layer. It is believed that the (111)-oriented region exists over a portion of the surface of the first electrode layer where titanium oxide does not exist. Moreover, 3 mol % of magnesium and 17 mol % of lanthanum were contained, and a 6 mol % excess of Pb was contained.

Next, as in Example 1, before the formation of the second electrode layer, 100 cantilevers having a size of 15 mm×2 mm were cut out by dicing. Then, the second electrode layer having a thickness of 0.1 μm was formed thereon by a sputtering method, and the piezoelectric constant d31 was measured. The average piezoelectric constant of the 100 cantilevers was −129 pC/N (deviation: $\sigma$=2.9%).

Then, the second electrode layer of the piezoelectric element was formed as 65 pieces of Pt film each having a size of 1 mm×1 mm and a thickness of 0.1 μm and arranged at an interval of 10 mm by a sputtering method using a metal mask. The breakdown voltage was measured by applying a voltage between each second electrode layer and the first electrode layer. As a result, the average breakdown voltage value was 118 V (deviation: $\sigma$=4.8%).

EXAMPLE 3

In Example 3, a barium borosilicate glass having a thickness of 0.5 mm (size: 100 mm×100 mm) was used as the substrate, a nickel (Ni) film having a thickness of 0.005 μm was used as the adhesive layer, an iridium (Ir) film having a thickness of 0.15 μm and containing 18 mol % of titanium was used as the first electrode layer, a PLT film (to which 1 mol % of manganese was added) having a thickness of 0.02 μm and containing 8 mol % of lanthanum in which the lead content was 16 mol % in excess of the stoichiometric composition was used as the orientation control layer, a PZT film (Zr/Ti=60/40) having a thickness of 2.6 μm was used as the piezoelectric layer, and a Pt film having a thickness of 0.01 μm was used as the second electrode layer.

The adhesive layer was obtained by using an Ni target and applying a high-frequency power of 200 W thereto for 1 minute while heating the substrate to 300° C. in an argon gas at 1 Pa.

The first electrode layer was obtained by using a Ti target and an Ir target and applying high-frequency powers of 160 W and 200 W thereto, respectively, for 10 minutes while heating the substrate to 600° C. in an argon gas at 1 Pa, using a multi-target sputtering apparatus.

The orientation control layer was obtained by using a sinter target, which was prepared by adding 2 mol % of manganese and a 22 mol % excess of lead oxide (PbO) to PLT containing 12 mol % of lanthanum, and applying a high-frequency power of 300 W thereto for 15 minutes at a substrate temperature of 580° C. in a mixed atmosphere of argon and oxygen (gas volume ratio: Ar:$O_2$=19:1) at a degree of vacuum of 0.8 Pa.

The piezoelectric layer was obtained by using a sinter target of PZT (Zr/Ti=60/40) and applying a high-frequency power of 260 W thereto for 3 hours at a substrate temperature of 580° C. in a mixed atmosphere of argon and oxygen (gas volume ratio: Ar:$O_2$=19:1) at a degree of vacuum of 0.3 Pa.

The second electrode layer was obtained by using a Pt target and applying a high-frequency power of 200 W thereto at a room temperature in an argon gas at 1 Pa.

Also in Example 3, no crack or peeling off was observed for any of the films of the piezoelectric element.

Then, the crystal orientation and the film composition of the piezoelectric layer before the formation of the second electrode layer were examined, indicating that the piezoelectric layer had a (100)-oriented rhombohedral perovskite crystalline structure (degree of (100) orientation: α=95%). Moreover, an examination of the composition of the PZT film showed that the Zr/Ti ratio was 60/40 as in the target composition.

Then, the crystal orientation and the film composition of the first electrode layer before the formation of the orientation control layer were examined, indicating that the Ir film was oriented along the (111) plane. Moreover, the Ti content was 18 mol %.

Then, the crystal orientation and the film composition of the orientation control layer before the formation of the piezoelectric layer were examined, indicating that the PLT film had a (100)-oriented perovskite crystalline structure. Note that an amorphous region was observed on one side of the orientation control layer that is closer to the first electrode layer. It is believed that the amorphous region exists over a portion of the surface of the first electrode layer where titanium does not exist. Moreover, 1 mol % of manganese and 8 mol % of lanthanum were contained, and a 16 mol % excess of Pb was contained.

Next, before the formation of the second electrode layer, 100 cantilevers having a size of 15 mm×2 mm were cut out by dicing. Then, the second electrode layer having a thickness of 0.01 μm was formed thereon by a sputtering method, and the piezoelectric constant d31 was measured. The average piezoelectric constant of the 100 cantilevers was −122 pC/N (deviation: σ=3.6%).

Then, the second electrode layer of the piezoelectric element was formed as 65 pieces of Pt film each having a size of 1 mm×1 mm and a thickness of 0.01 μm and arranged at an interval of 10 mm by a sputtering method using a metal mask. The breakdown voltage was measured by applying a voltage between each second electrode layer and the first electrode layer. As a result, the average breakdown voltage value was 115 V (deviation: σ=5.2%).

EXAMPLE 4

In Example 4, a 4-inch silicon wafer having a thickness of 0.5 mm was used as the substrate, a titanium film having a thickness of 0.01 μm was used as the adhesive layer, an Ir film having a thickness of 0.25 μm and containing 5 mol % of titanium oxide was used as the first electrode layer, a PLT film having a thickness of 0.05 μm and containing 10 mol % of lanthanum in which the lead content was 10 mol % in excess of the stoichiometric composition was used as the orientation control layer, a PZT film (Zr/Ti=52/48) having a thickness of 3.2 μm was used as the piezoelectric layer, and a Pt film having a thickness of 0.01 μm was used as the second electrode layer.

The adhesive layer was obtained by using an Ti target and applying a high-frequency power of 100 W thereto for 1 minute while heating the substrate to 500° C. in an argon gas at 1 Pa.

The first electrode layer was obtained by using a Ti target and an Ir target and applying high-frequency powers of 90 W and 200 W thereto, respectively, for 12 minutes while heating the substrate to 400° C. in a mixed atmosphere of argon and oxygen (gas volume ratio: Ar: $O_2$=10:1) at 1 Pa, using a multi-target sputtering apparatus.

The orientation control layer was obtained by using a sinter target prepared by adding a 14 mol % excess of lead oxide (PbO) to PLT containing 10 mol % of lanthanum and applying a high-frequency power of 300 W thereto for 20 minutes at a substrate temperature of 600° C. in a mixed atmosphere of argon and oxygen (gas volume ratio: Ar:$O_2$=15:1) at a degree of vacuum of 0.84 Pa.

The piezoelectric layer was obtained by using a sinter target of PZT (Zr/Ti=52/48) and applying a high-frequency power of 270 W thereto for 3 hours at a substrate temperature of 620° C. in a mixed atmosphere of argon and oxygen (gas volume ratio: Ar:$O_2$=19:1) at a degree of vacuum of 0.4 Pa.

The second electrode layer was obtained by using a Pt target and applying a high-frequency power of 200 W thereto at a room temperature in an argon gas at 1 Pa.

Also in Example 4, no crack or peeling off was observed for any of the films of the piezoelectric element.

Then, the crystal orientation and the film composition of the piezoelectric layer before the formation of the second electrode layer were examined, indicating that the piezoelectric layer had a (100)-oriented rhombohedral perovskite crystalline structure (degree of (100) orientation: α=99%). Moreover, an examination of the composition of the PZT film showed that the Zr/Ti ratio was 52/48 as in the target composition.

Then, the crystal orientation and the film composition of the first electrode layer before the formation of the orientation control layer were examined, indicating that the Ir film was oriented along the (111) plane. Moreover, the titanium oxide content was 5 mol %.

Then, the crystal orientation and the film composition of the orientation control layer before the formation of the piezoelectric layer were examined, indicating that the PLT film had a (100)-oriented perovskite crystalline structure.

Note that an amorphous region was observed on one side of the orientation control layer that is closer to the first electrode layer. It is believed that the amorphous region exists over a portion of the surface of the first electrode layer where titanium oxide does not exist. Moreover, 10 mol % of lanthanum was contained, and a 10 mol % excess of Pb was contained.

Next, before the formation. of the second electrode layer, 100 cantilevers having a size of 15 mm×2 mm were cut out by dicing. Then, the second electrode layer having a thickness of 0.01 μm was formed thereon by a sputtering method, and the piezoelectric constant d31 was measured. The average piezoelectric constant of the 100 cantilevers was −141 pC/N (deviation: σ=2.4%).

Then, the second electrode layer of the piezoelectric element was formed as 65 pieces of Pt film each having a size of 1 mm×1 mm and a thickness of 0.01 μm and arranged at an interval of 10 mm by a sputtering method using a metal mask. The breakdown voltage was measured by applying a voltage between each second electrode layer and the first electrode layer. As a result, the average breakdown voltage value was 122 V (deviation: σ=4.1%).

EXAMPLE 5

In Example 5, a 4-inch silicon wafer having a thickness of 0.3 mm was used as the substrate, the first electrode layer was formed directly on the substrate without providing the adhesive layer therebetween, a Pt film having a thickness of 0.22 μm and containing 2.1 mol % of titanium was used as the first electrode layer, a PLZT film (to which 3 mol % of magnesium was added) having a thickness of 0.03 μm and containing 12 mol % of lanthanum and 15 mol % of zirconium in which the lead content was 18 mol % in excess of the stoichiometric composition was used as the orientation control layer, a PZT film (Zr/Ti=53/47) having a thickness of 3 μm was used as the piezoelectric layer, and a Pt film having a thickness of 0.2 μm was used as the second electrode layer.

The first electrode layer was obtained by using a Ti target and a Pt target and applying high-frequency powers of 85 W and 200 W thereto, respectively, for 12 minutes while heating the substrate to 400° C. in an argon gas at 1 Pa, using a multi-target sputtering apparatus.

The orientation control layer was obtained by using a sinter target, which was prepared by adding 3 mol % of magnesium and a 24 mol % excess of lead oxide (PbO) to PLZT containing 14 mol % of lanthanum and 15 mol % of zirconium, and applying a high-frequency power of 300 W thereto for 12 minutes at a substrate temperature of 600° C. in a mixed atmosphere of argon and oxygen (gas volume ratio: $Ar:O_2$=19:1) at a degree of vacuum of 0.8 Pa.

The piezoelectric layer was obtained by using a sinter target of PZT (Zr/Ti=53/47) and applying a high-frequency power of 250 W thereto for 3 hours at a substrate temperature of 610° C. in a mixed atmosphere of argon and oxygen (gas volume ratio: $Ar:O_2$=19:1) at a degree of vacuum of 0.3 Pa.

The second electrode layer was obtained by using a Pt target and applying a high-frequency power of 200 W thereto at a room temperature in an argon gas at 1 Pa.

Also in Example 5, no crack or peeling off was observed for any of the films of the piezoelectric element.

Then, the crystal orientation and the film composition of the piezoelectric layer before the formation of the second electrode layer were examined, indicating that the piezoelectric layer had a (100)-oriented rhombohedral perovskite crystalline structure (degree of (100) orientation: α=98%). Moreover, an examination of the composition of the PZT film showed that the Zr/Ti ratio was 53/47 as in the target composition.

Then, the crystal orientation and the film composition of the first electrode layer before the formation of the orientation control layer were examined, indicating that the Pt film was oriented along the (111) plane. Moreover, the titanium content was 2.1 mol %.

Then, the crystal orientation and the film composition of the orientation control layer before the formation of the piezoelectric layer were examined, indicating that the PLT film had a (100)-oriented perovskite crystalline structure. Note that a (111)-oriented region was observed on one side of the orientation control layer that is closer to the first electrode layer. It is believed that the (111)-oriented region exists over a portion of the surface of the first electrode layer where titanium does not exist. Moreover, 3 mol % of magnesium and 12 mol % of lanthanum were contained, and a 18 mol % excess of Pb was contained.

Next, before the formation of the second electrode layer, 100 cantilevers having a size of 15 mm×2 mm were cut out by dicing. Then, the second electrode layer having a thickness of 0.2 μm was formed thereon by a sputtering method, and the piezoelectric constant d31 was measured. The average piezoelectric constant of the 100 cantilevers was −130 pC/N (deviation: σ=4.12%).

Then, the second electrode layer of the piezoelectric element was formed as 65 pieces of Pt film each having a size of 1 mm×1 mm and a thickness of 0.2 μm and arranged at an interval of 10 mm by a sputtering method using a metal mask. The breakdown voltage was measured by applying a voltage between each second electrode layer and the first electrode layer. As a result, the average breakdown voltage value was 120 V (deviation: σ=4.0%).

COMPARATIVE EXAMPLE

A piezoelectric element of Comparative Example is different from that of Example 1 only in that an orientation control layer is not provided. In the piezoelectric element of Comparative Example, an adhesive layer, a first electrode layer, a piezoelectric layer, and a second electrode layer are formed on a substrate in this order.

The piezoelectric layer of the piezoelectric element of Comparative Example had a (100)-oriented rhombohedral perovskite crystalline structure (degree of (100) orientation: α=31%).

Moreover, the piezoelectric constant d31 was measured as in Example 1, indicating that the average piezoelectric constant was −72 pC/N (deviation: σ=11.5%).

Furthermore, the breakdown voltage was measured as in Example 1, indicating that the average breakdown voltage value was 65 V (deviation: σ=14.5%).

It is thus understood that, only by providing the orientation control layer as in Example 1, it is possible to improve the crystallinity and the orientation of the piezoelectric layer, and to improve the piezoelectric characteristics and the breakdown voltage of the piezoelectric element.

EXAMPLE 6

A piezoelectric element of Example 6 is different from that of Example 1 only in the material of the orientation control layer. (Note that the sputtering conditions for the orientation control layer of Example 6 are the same as those employed in Example 1.) Specifically, the orientation control layer of Example 6 is made of lead titanate (PT) not containing La.

The lead content of the orientation control layer is not in excess of the stoichiometric composition.

The piezoelectric layer of the piezoelectric element of Example 6 had a (100)-oriented rhombohedral perovskite crystalline structure (degree of (100) orientation: $\alpha$=41%). Moreover, the average piezoelectric constant was −82 pC/N (deviation: $\sigma$=9.2%). Furthermore, the average breakdown voltage value was 82 V (deviation: $\sigma$=12.1%).

It is thus understood that, even with such an orientation control layer of Example 6, it is possible to improve the crystallinity and the orientation of the piezoelectric layer and to improve the piezoelectric characteristics and the breakdown voltage of the piezoelectric element as compared with the piezoelectric element of Comparative Example.

Furthermore, as seen from the comparison with Example 1, by adding lanthanum to the orientation control layer and excessively providing Pb, the orientation of the piezoelectric layer is significantly improved.

EMBODIMENT 2

Figure 3:
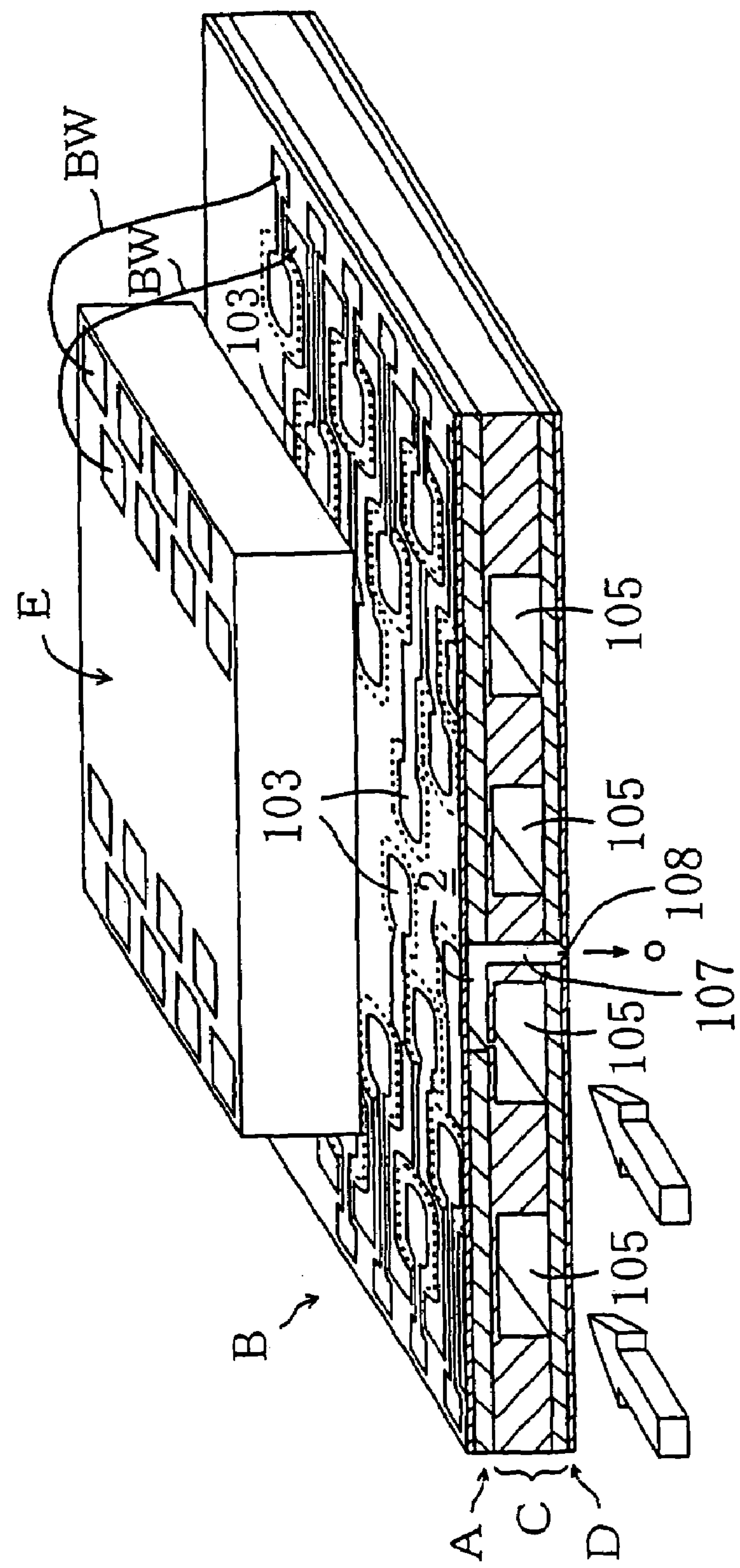
FIG. 3 is a perspective view illustrating the general structure of an ink jet head according to an embodiment of the present invention.
Figure 4:
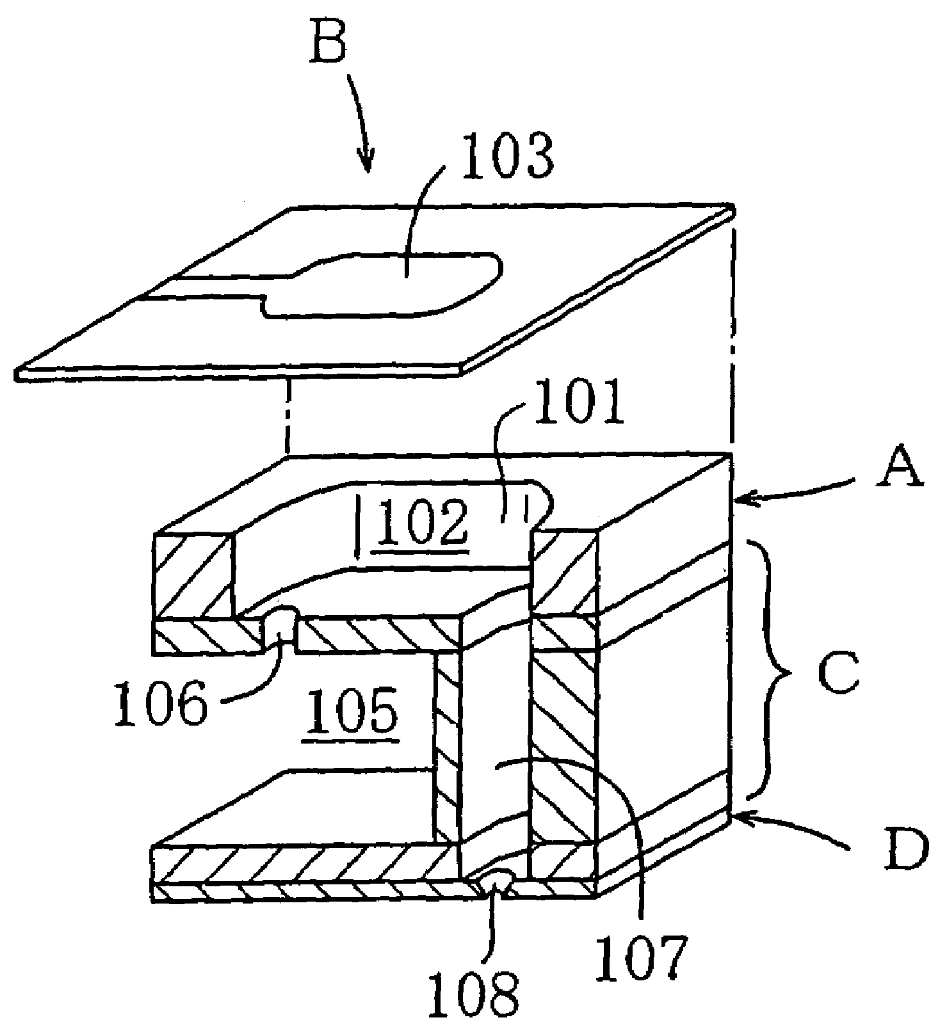
FIG. 4 is an exploded perspective view illustrating an important part of a pressure chamber member and an actuator section of the ink jet head.

FIG. 3 illustrates the general structure of an ink jet head according to an embodiment of the present invention, and FIG. 4 illustrates the structure of an important part thereof In FIG. 3 and FIG. 4, the reference character A denotes a pressure chamber member. A pressure chamber cavity 101 is formed running through the pressure chamber member A in the thickness direction (vertical direction) thereof. The reference character B denotes an actuator section placed so as to cover the upper opening of the pressure chamber cavity 101, and the reference character C denotes an ink channel member placed so as to cover the lower opening of the pressure chamber cavity 101. Each pressure chamber cavity 101 of the pressure chamber member A is closed by the actuator section B and the ink channel member C, placed on and under the pressure chamber member A, respectively, thereby forming a pressure chamber 102.

The actuator section B includes a first electrode layer 103 (separate electrode) above each pressure chamber 102. The position of the first electrode layer 103 generally corresponds to that of the pressure chamber 102. As can be seen from FIG. 3, a large number of pressure chambers 102 and first electrode layers 103 are arranged in a staggered pattern.

The ink channel member C includes a common ink chamber 105 shared by a number of pressure chambers 102 arranged in the ink supply direction, a supply port 106 through which ink in the common ink chamber 105 is supplied into the pressure chamber 102, and an ink channel 107 through which ink in the pressure chamber 102 is discharged.

The reference character D denotes a nozzle plate. The nozzle plate D includes nozzle holes 108 each of which is communicated to the ink channel 107. Moreover, the reference character E denotes an IC chip. A voltage is supplied from the IC chip E to each separate electrode 103 via a bonding wire BW.

Figure 5:
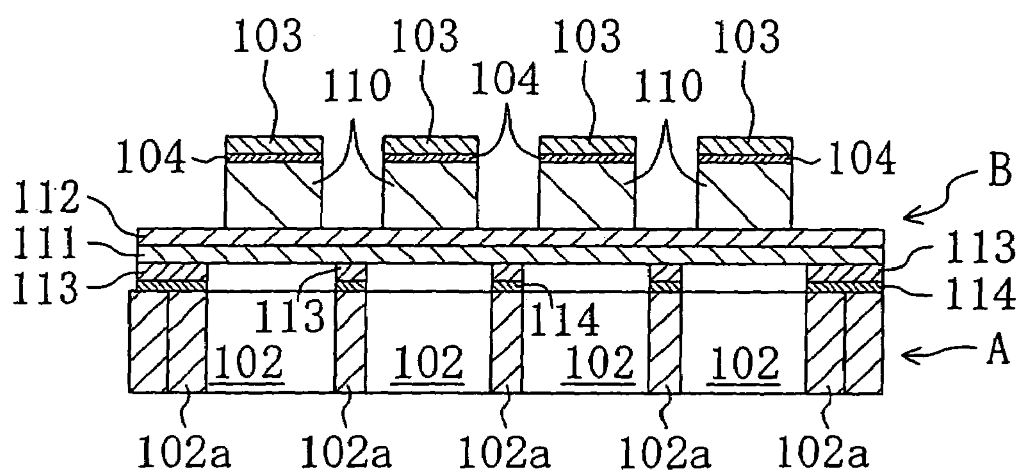
FIG. 5 is a cross-sectional view illustrating an important part of a pressure chamber member and an actuator section of the ink jet head.

Next, the structure of the actuator section B will be described with reference to FIG. 5. FIG. 5 is a cross-sectional view taken along the direction perpendicular to the ink supply direction shown in FIG. 3. For the purpose of illustration, FIG. 5 shows the pressure chamber member A including four pressure chambers 102 arranged in the direction perpendicular to the ink supply direction. The actuator section B includes: the first electrode layers 103 each located above one pressure chamber 102 so that the position of the first electrode layer 103 generally corresponds to that of the pressure chamber 102, an orientation control layer 104 provided on (under, as shown in the figure) each first electrode layer 103, a piezoelectric layer 110 provided on (under) the orientation control layer 104, a second electrode layer 112 (common electrode) provided on (under) the piezoelectric layers 110 and shared by all the piezoelectric layers 110, a vibration layer 111 provided on (under) the second electrode layer 112, which is displaced and vibrates in the thickness direction by the piezoelectric effect of the piezoelectric layer 110, and an intermediate layer 113 (vertical wall) provided on (under) the vibration layer 111 and located above a partition wall 102*a* for partitioning the pressure chambers 102 from one another. The first electrode layer 103, the orientation control layer 104, the piezoelectric layer 110 and the second electrode layer 112 are arranged in this order to form a piezoelectric element. Moreover, the vibration layer 111 is provided on one surface of the piezoelectric element that is closer to the second electrode layer 112.

Note that in FIG. 5, the reference numeral 114 denotes an adhesive for bonding the pressure chamber member A and the actuator section B to each other. Therefore, even if a portion of the adhesive 114 runs out of the partition wall 102*a* in the adhesion process using the adhesive 114, the intermediate layer 113 functions to increase the distance between the upper surface of the pressure chamber 102 and the lower surface of the vibration layer 111 so that such a portion of the adhesive 114 does not attach to the vibration layer 111 and that the vibration layer 111 will be displaced and vibrate as intended. Thus, it is preferred that the pressure chamber member A is bonded to one surface of the vibration layer 111 of the actuator section B that is away from the second electrode layer 112 via the intermediate layer 113 therebetween. However, the pressure chamber member A may alternatively be bonded directly to one surface of the vibration layer 111 that is away from the second electrode layer 112.

The materials of the first electrode layer 103, the orientation control layer 104, the piezoelectric layer 110 and the second electrode layer 112 are similar to those of the first electrode layer 14, the orientation control layer 15, the piezoelectric layer 16 and the second electrode layer 17, respectively, of Embodiment 1. (The contents of constituent elements may differ.) Moreover, the structures of the orientation control layer 104 and the piezoelectric layer 110 are similar to those of the orientation control layer 15 and the piezoelectric layer 16, respectively. In the vicinity of one surface of the orientation control layer 104 that is closer to the first electrode layer 103, a (100)- or (001)-oriented region extends over titanium located on one surface of the first electrode layer 103 that is closer to the orientation control layer 104 so that the cross-sectional area of such a region in the direction perpendicular to the thickness direction gradually increases in the direction away from the first electrode layer 103 toward the piezoelectric layer 110.

Next, a method for manufacturing the ink jet head excluding the IC chip E of FIG. 3, i.e., the ink jet head including the pressure chamber member A, the actuator section B, the ink channel member C and the nozzle plate D illustrated in FIG. 4, will be described with reference to FIG. 6 to FIG. 10.

Figure 6:
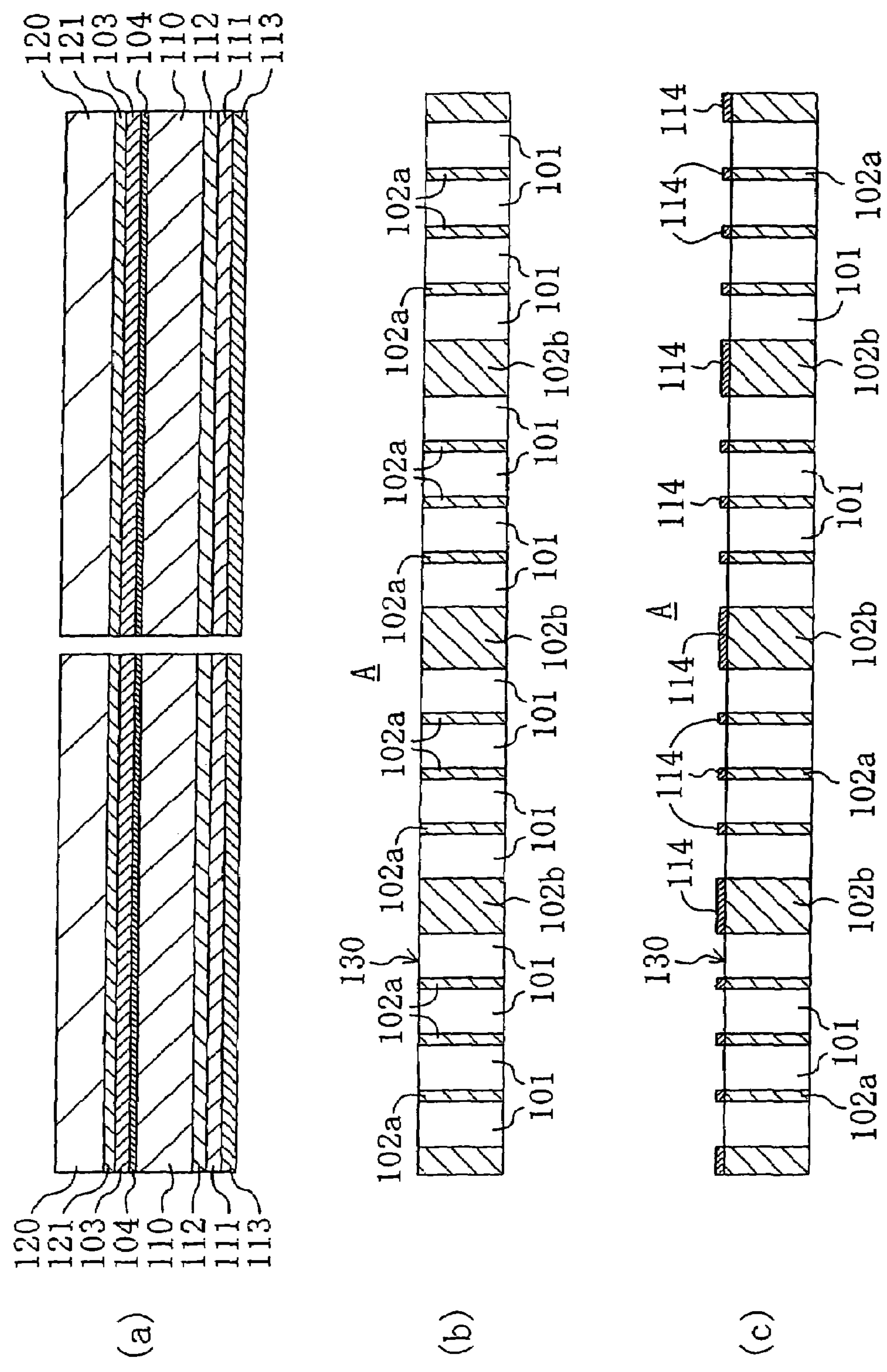
FIG. 6 illustrates a deposition step, a step of forming pressure chamber cavities, and an adhesive application step, respectively, in a method for manufacturing the ink jet head.

As illustrated in FIG. 6(*a*), an adhesive layer 121, the first electrode layer 103, the orientation control layer 104, the piezoelectric layer 110, the second electrode layer 112, the vibration layer 111 and the intermediate layer 113 are deposited in this order on a substrate 120 by a sputtering method. Note that the adhesive layer 121 is similar to the adhesive layer 12 of Embodiment 1, and is formed between the substrate 120 and the first electrode layer 103 in order to improve the adhesion therebetween (it may not always be necessary to form the adhesive layer 121). As will be described later, the adhesive layer 121 is subsequently removed as is the substrate 120. Moreover, Cr is used as the material of the vibration layer 111, and Ti is used as the material of the intermediate layer 113.

A cut-out Si substrate having a size of 18 mm×18 mm is used as the substrate 120. The substrate 120 is not limited to an Si substrate, but may alternatively be a glass substrate, a metal substrate, or a ceramic substrate. Moreover, the substrate size is not limited to 18 mm×18 mm, and a wafer having a diameter of 2 to 10 inches may be used as long as it is an Si substrate.

The adhesive layer 121 is obtained by using a Ti target and applying a high-frequency power of 100 W thereto for 1 minute while heating the substrate 120 to 400° C. in an argon gas at 1 Pa. The thickness of the adhesive layer 121 is 0.02 μm. Note that the material of the adhesive layer 121 is not limited to Ti, but may alternatively be tantalum, iron, cobalt, nickel, chromium, or a compound thereof (including Ti). Moreover, the thickness is not limited to any particular thickness as long as it is in the range of 0.005 to 0.2 μm.

The first electrode layer 103 was obtained by using a Ti target and a Pt target and applying high-frequency powers of 85 W and 200 W thereto, respectively, for 12 minutes while heating the substrate 120 to 600° C. in an argon gas at 1 Pa, using a multi-target sputtering apparatus. The first electrode layer 103 has a thickness of 0.2 μm, and is oriented along the (111) plane. Moreover, the Ti content is 2.5 mol %. As is the first electrode layer 14 of Embodiment 1, the first electrode layer 103 may be made of at least one noble metal selected from the group consisting of Pt, iridium, palladium and ruthenium to which titanium or titanium oxide is added (the amount of the additive to be added is preferably greater than zero and less than or equal to 30 mol %), and the thickness thereof is not limited to any particular thickness as long as it is in the range of 0.05 to 2 μm.

The orientation control layer 104 is obtained by using a sinter target prepared by adding a 15 mol % excess of lead oxide (PbO) to PLT containing 10 mol % of lanthanum and applying a high-frequency power of 300 W thereto for 12 minutes while heating the substrate 120 to 600° C. in a mixed atmosphere of argon and oxygen (gas volume ratio: $Ar:O_2=19:1$) at a degree of vacuum of 0.8 Pa. The obtained lead lanthanum titanate film has a perovskite crystalline structure containing 10 mol % of lanthanum and containing lead 10% in excess of the stoichiometric composition, and is oriented along the (100) or (001) plane over titanium located on one surface of the first electrode layer 103 that is closer to the orientation control layer 104 so that the cross-sectional area of the (100)- or (001)-oriented region gradually increases in the direction away from the first electrode layer 103 toward the other side (i.e., toward the piezoelectric layer 110). On the other hand, each region of the orientation control layer 104, which is located over a portion of the surface of the first electrode layer 103 where none of titanium and titanium oxide exist, is not oriented along the (100) or (001) plane, but such a region gradually shrinks toward the piezoelectric layer 110. In the present embodiment, the thickness of the orientation control layer 104 is 0.02 μm, whereby the (100)- or (001)-oriented region extends substantially across the entire surface of the orientation control layer 104 that is closer to the piezoelectric layer 110.

Note that as with the orientation control layer 15 of Embodiment 1, the La content of the orientation control layer 104 may be greater than zero and less than or equal to 25 mol %, and the lead content thereof may be in excess of the stoichiometric composition by an amount greater than zero and less than or equal to 30 mol %. Moreover, the material of the orientation control layer 104 may be PLZT obtained by adding zirconium to PLT (the zirconium content is preferably 20 mol % or less), or may be a material obtained by adding at least one of magnesium and manganese to PLT or PLZT (the amount of magnesium and manganese to be added is preferably greater than zero and less than or equal to 10 mol %). Moreover, the thickness of the orientation control layer 104 is not limited to any particular thickness as long as it is in the range of 0.01 to 0.2 μm.

The piezoelectric layer 110 is obtained by using a sinter target of PZT (Zr/Ti=52/48) and applying a high-frequency power of 250 W thereto for 3 hours while heating the substrate 120 to 580° C. in a mixed atmosphere of argon and oxygen (gas volume ratio: $Ar:O_2=15:1$) at a degree of vacuum of 0.3 Pa. The obtained PZT film has a rhombohedral perovskite crystalline structure, and is oriented along the (100) plane. Moreover, the thickness of the piezoelectric layer 110 is 3.1 μm. Note that the Zr/Ti composition of the piezoelectric layer 110 is not limited to any particular composition as long as it is in the range of 30/70 to 70/30, and the thickness thereof is not limited to any particular thickness as long as it is in the range of 1 to 5 μm. Moreover, the material of the piezoelectric layer 110 is not limited to any particular material, as long as it is a piezoelectric material whose main component is PZT, e.g., those obtained by adding an additive such as Sr, Nb or Al to PZT. For example, PMN or PZN may be used.

The second electrode layer 112 is obtained by using a Pt target and applying a high-frequency power of 200 W thereto for 10 minutes at a room temperature in an argon gas at 1 Pa. The thickness of the second electrode layer 112 is 0.2 μm. Note that the material of the second electrode layer 112 is not limited to Pt as long as it is a conductive material, and the thickness thereof is not limited to any particular thickness as long as it is in the range of 0.1 to 0.4 μm.

The vibration layer 111 is obtained by using a Cr target and applying a high-frequency power of 200 W thereto for 6 hours at a room temperature in an argon gas at 1 Pa. The thickness of the vibration layer 111 is 3 μm. The material of the vibration layer 111 is not limited to Cr, but may alternatively be nickel, aluminum, tantalum, tungsten, silicon, or an oxide or nitride thereof (e.g., silicon dioxide, aluminum oxide, zirconium oxide, silicon nitride), etc. Moreover, the thickness of the vibration layer 111 is not limited to any particular thickness as long as it is in the range of 2 to 5 μm.

The intermediate layer 113 is obtained by using a Ti target and applying a high-frequency power of 200 W thereto for 5 hours at a room temperature in an argon gas at 1 Pa. The thickness of the intermediate layer 113 is 5 μm. The material of the intermediate layer 113 is not limited to Ti, but may alternatively be any suitable conductive metal material such as Cr. Moreover, the thickness of the intermediate layer 113 is not limited to any particular thickness as long as it is in the range of 3 to 10 μm.

On the other hand, the pressure chamber member A is formed as illustrated in FIG. 6(*b*). The pressure chamber member A is formed by using a substrate of a larger size than the Si substrate 120, e.g., a 4-inch wafer silicon substrate 130 (see FIG. 11). Specifically, a plurality of pressure chamber cavities 101 are first formed by patterning in the silicon substrate 130 (for forming the pressure chamber member). As can be seen from FIG. 6(*b*), in the patterning process, the width of a partition wall 102*b* for partitioning pairs of four pressure chamber cavities 101 from one another is set to be about twice as large as that of the partition wall 102*a* for partitioning the pressure chamber cavities 101 from one another in each pair. Then, the patterned silicon substrate 130 is subjected to chemical etching, dry etching, or the like, to form four pressure chamber cavities 101 for each pair, thereby obtaining the pressure chamber member A.

Thereafter, the silicon substrate 120 (for depositing films thereon) after the deposition process and the pressure chamber member A are bonded to each other with an adhesive. The application of the adhesive is done by electrodeposition. Specifically, the adhesive 114 is first applied onto the bonding surface of the pressure chamber member A, i.e., the upper surface of the pressure chamber partition walls 102*a* and 102*b*, by electrodeposition, as illustrated in FIG. 6(*c*). Specifically, although not shown, an Ni thin film having a thickness on the order of 100 Å such that light can pass therethrough is formed as a base electrode film on the upper surface of the partition walls 102*a* and 102*b* by a sputtering method, and then a patterned layer of the adhesive resin agent 114 is formed on the Ni thin film. In this process, the electrodeposition solution may be a solution obtained by adding 0 to 50% by weight of pure water to an acrylic resin aqueous dispersion, followed by thorough stirring and mixing. The Ni thin film is so thin that light can pass therethrough, so that it can easily be visually observed that the adhesive resin has completely attached to the silicon substrate 130 (for forming the pressure chamber member). Experimentally, preferred electrodeposition conditions include a solution temperature of about 25° C., a DC voltage of 30 V, and a voltage application time of 60 seconds, and an acrylic resin layer having a thickness of about 3 to 10 μm is electrodeposited under these conditions on the Ni thin film of the silicon substrate 130 (for forming the pressure chamber member).

Figure 7:
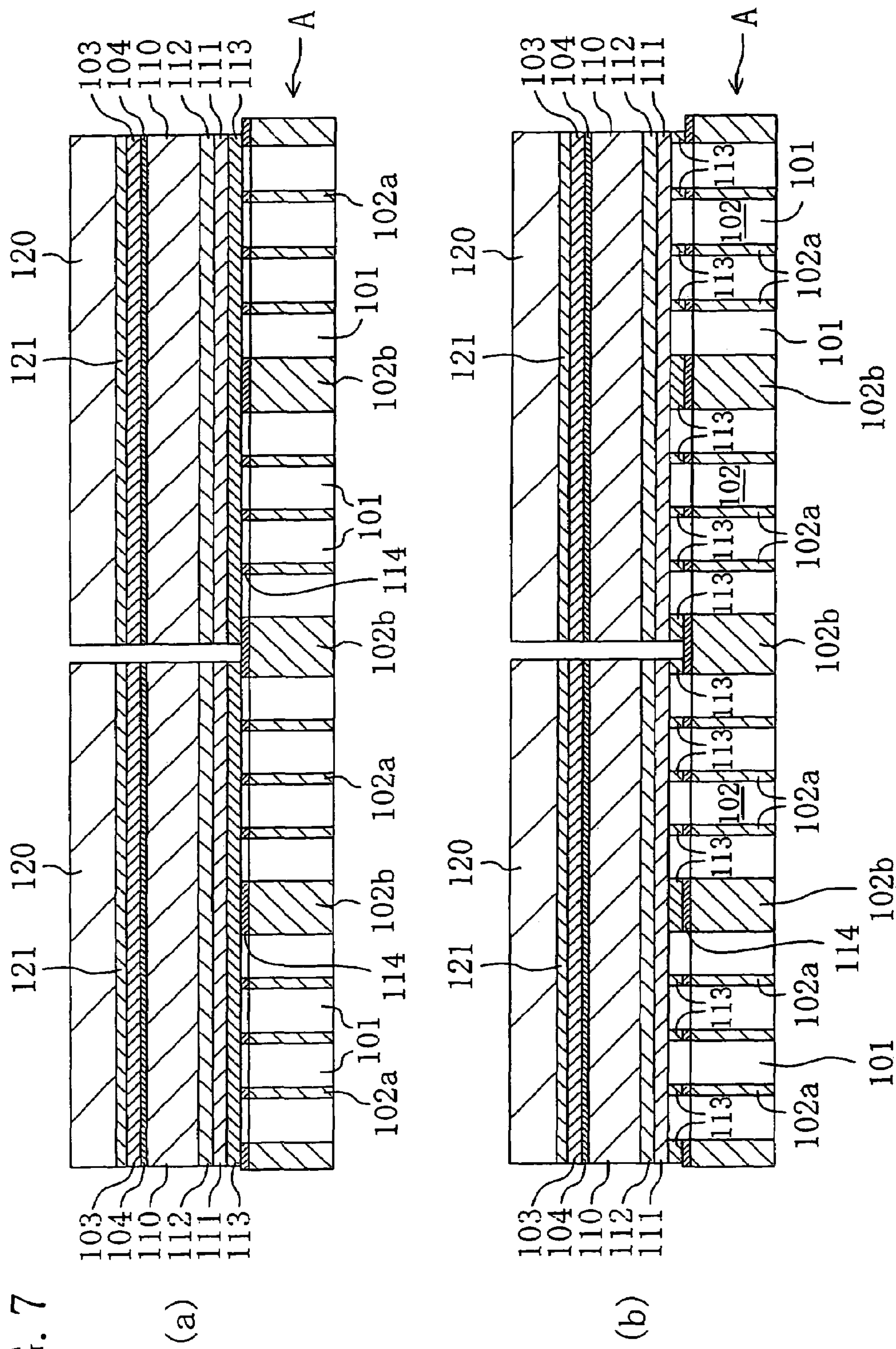
FIG. 7 illustrates a step of bonding a substrate after the deposition process and the pressure chamber member to each other, and a step of forming vertical walls, respectively, in the method for manufacturing the ink jet head.
Figure 11:
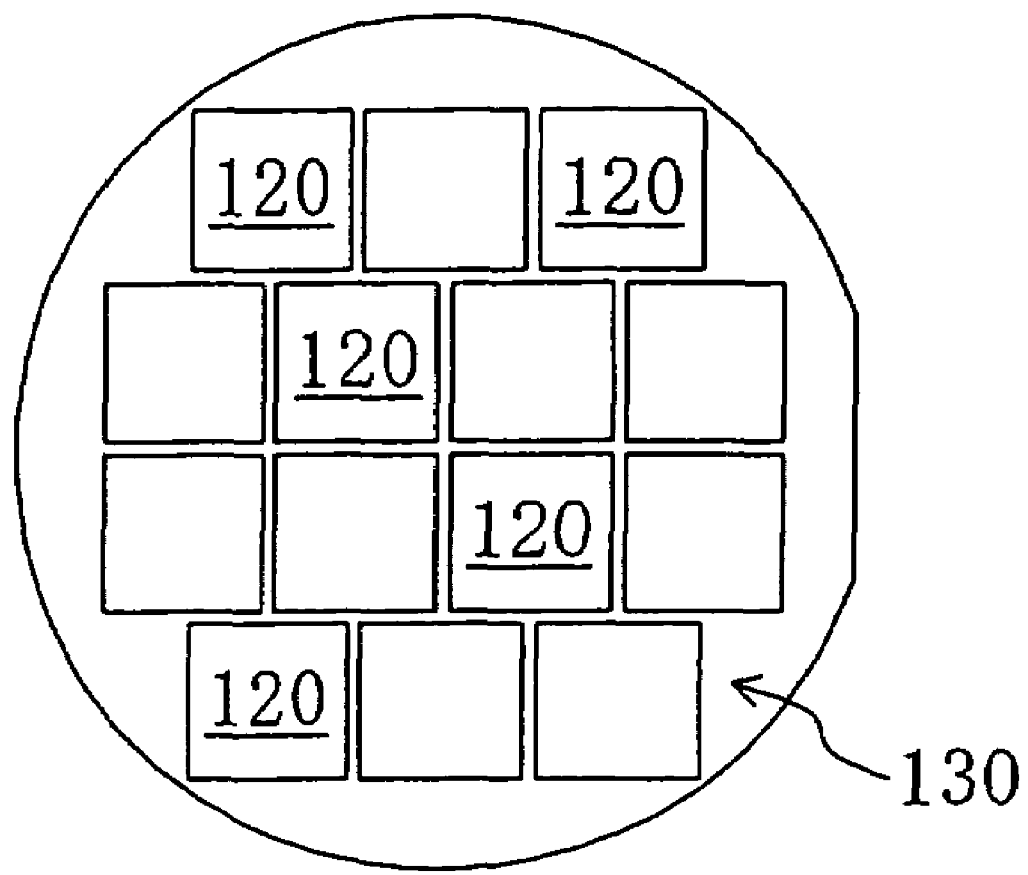
FIG. 11 is a plan view illustrating how Si substrates on which films have been deposited are bonded to an Si substrate for forming the pressure chamber member in the method for manufacturing the ink jet head.

Then, as illustrated in FIG. 7(*a*), the Si substrate 120 (for depositing films thereon) after the deposition process and the pressure chamber member A are bonded to each other with the electrodeposited adhesive 114. In the bonding process, the intermediate layer 113 deposited on the substrate 120 (for depositing films thereon) is used as the substrate-side bonding surface. Moreover, the Si substrate 120 (for depositing films thereon) has a size of 18 mm, whereas the Si substrate 130 for forming the pressure chamber member A is as large as 4 inches, a plurality (14 in the example illustrated in FIG. 11) of Si substrates 120 (for depositing films thereon) are attached to a single pressure chamber member A (the Si substrate 130), as illustrated in FIG. 11. The attachment is done while the center of each Si substrate 120 (for depositing films thereon) is aligned with the center of the wide partition wall 102*b* of the pressure chamber member A, as illustrated in FIG. 7(*a*). After the attachment, the pressure chamber member A is pressed against, and thus brought into close contact with, the Si substrate 120 (for depositing films thereon) so that they are bonded to each other fluid-tightly. Furthermore, the Si substrate 120 (for depositing films thereon) and the pressure chamber member A bonded to each other are gradually heated in a heating furnace so as to completely set the adhesive 114. Then, a plasma treatment is performed so as to remove excessive portions of the adhesive 114.

Note that although the Si substrate 120 (for depositing films thereon) after the deposition process and the pressure chamber member A are bonded to each other in FIG. 7(*a*), the Si substrate 130 (for forming the pressure chamber member) before the formation of the pressure chamber cavities 101 may alternatively be bonded to the Si substrate 120 (for depositing films thereon) after the deposition process.

Then, as illustrated in FIG. 7(*b*), the intermediate layer 113 is etched into a predetermined pattern using the partition walls 102*a* and 102*b* of the pressure chamber member A as a mask (so that remaining portions of the intermediate layer 113 are continuous with the partition walls 102*a* and 102*b* (thus forming vertical walls)). Then, as illustrated in FIG. 8(*a*), the Si substrate 120 (for depositing films thereon) and the adhesive layer 121 are removed by etching.

Figure 8:
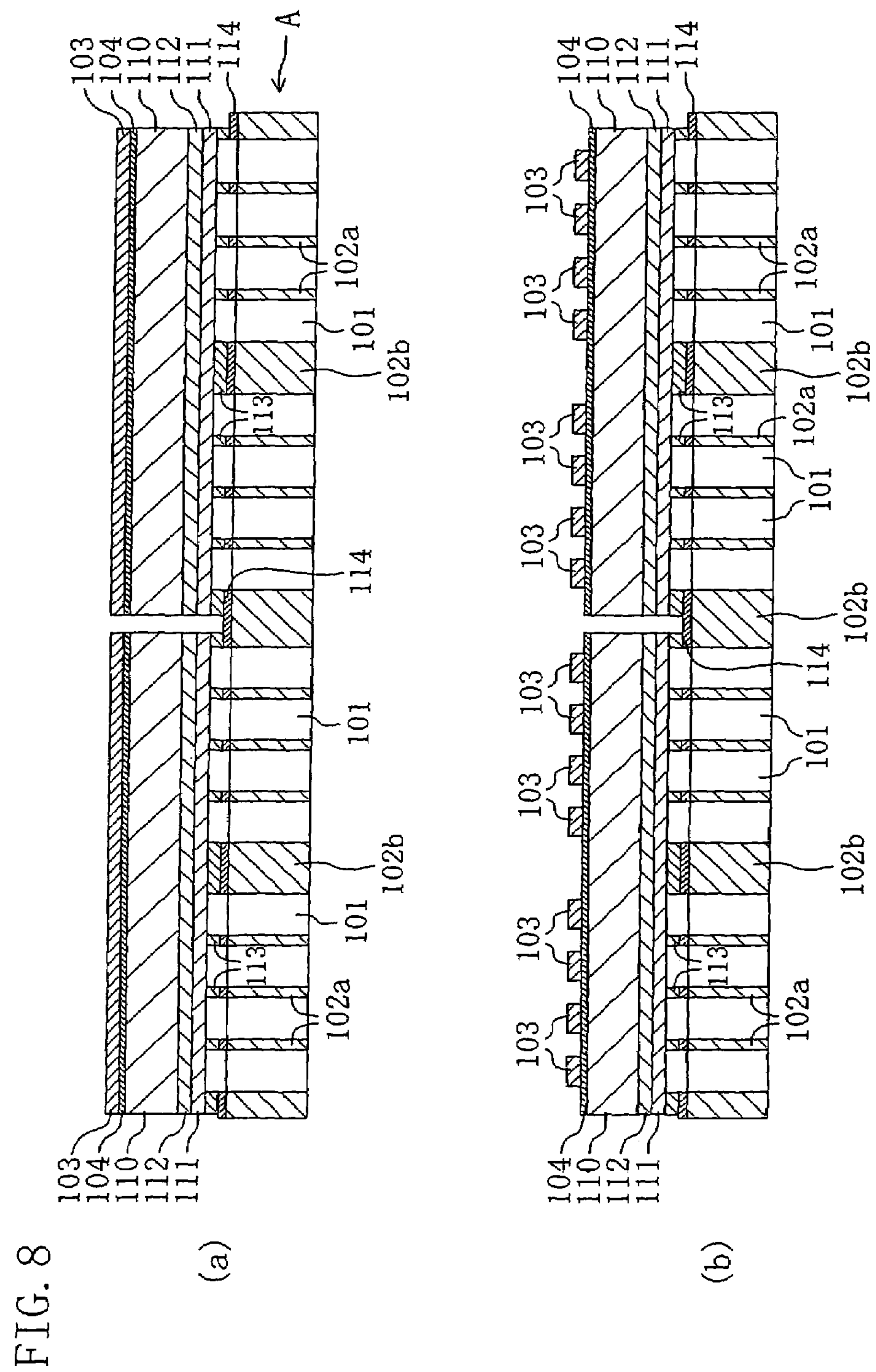
FIG. 8 illustrates a step of removing a substrate (for depositing films thereon) and an adhesive layer, and a step of dividing a first electrode layer, respectively, in the method for manufacturing the ink jet head.
Figure 9:
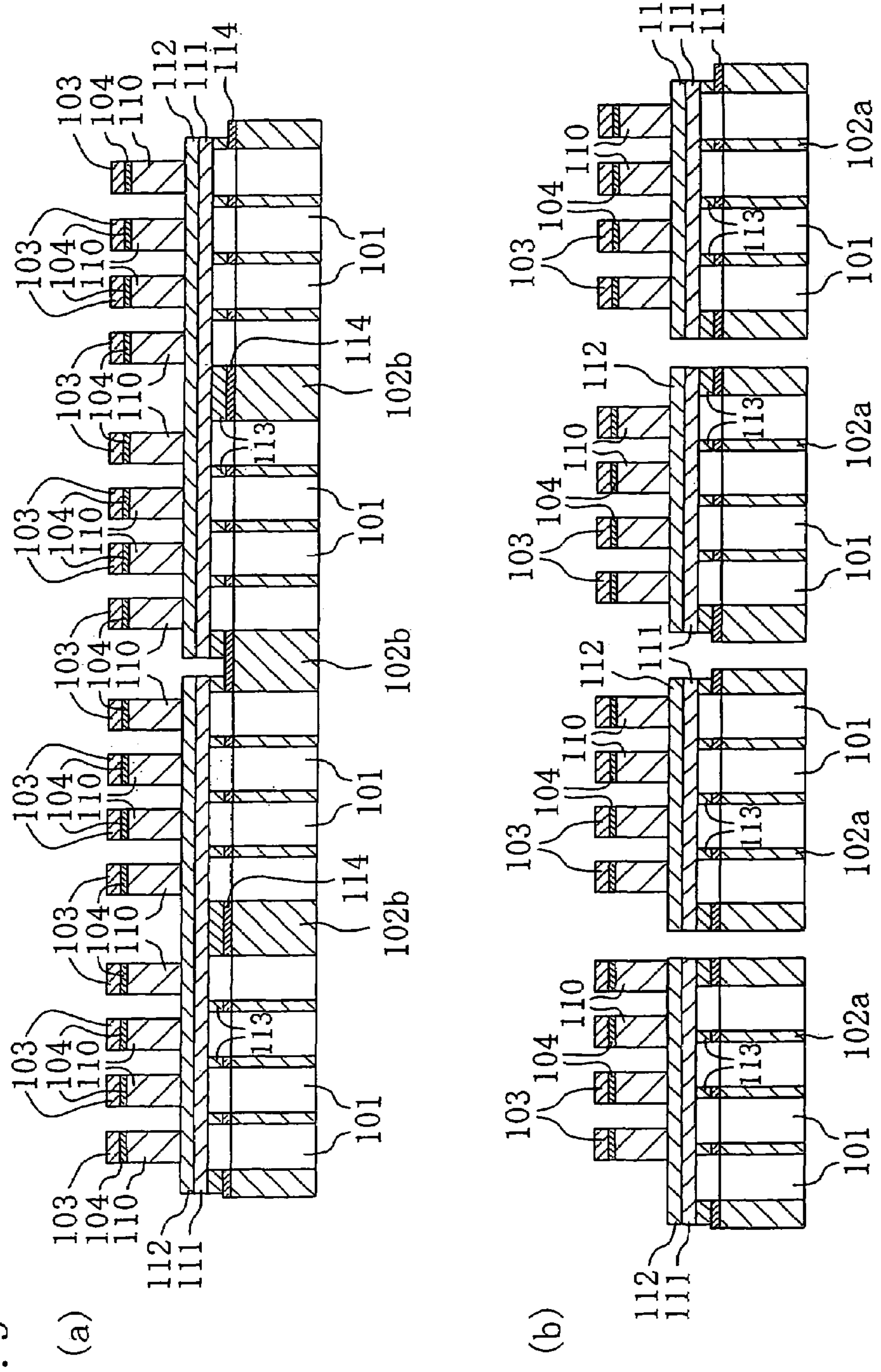
FIG. 9 illustrates a step of dividing the orientation control layer and the piezoelectric layer, and a step of cutting off a substrate (for forming the pressure chamber member), respectively, in the method for manufacturing the ink jet head.

Then, as illustrated in FIG. 8(*b*), the first electrode layer 103 located above the pressure chamber member A is etched by a photolithography technique so that the first electrode layer 103 is divided into portions each corresponding to one pressure chamber 102. Then, as illustrated in FIG. 9(*a*), the orientation control layer 104 and the piezoelectric layer 110 are etched by a photolithography technique so as to be divided into portions arranged in a pattern similar to that of the first electrode layer 103. The remaining portions of the first electrode layer 103, the orientation control layer 104 and the piezoelectric layer 110 after the etching process are located above the respective pressure chambers 102. The center of the width of each of the first electrode layer 103, the orientation control layer 104 and the piezoelectric layer 110 precisely corresponds to the center of the width of the corresponding pressure chamber 102. Thus, the first electrode layer 103, the orientation control layer 104 and the piezoelectric layer 110 are divided into portions each corresponding to one pressure chamber 102, and then the silicon substrate 130 (for forming the pressure chamber member) is cut along the wide partition walls 102*b*, thereby obtaining four sets of the pressure chamber member A, each including four pressure chambers 102, and the actuator section B fixed to the upper surface of the pressure chamber member A, as illustrated in FIG. 9(*b*).

Figure 10:
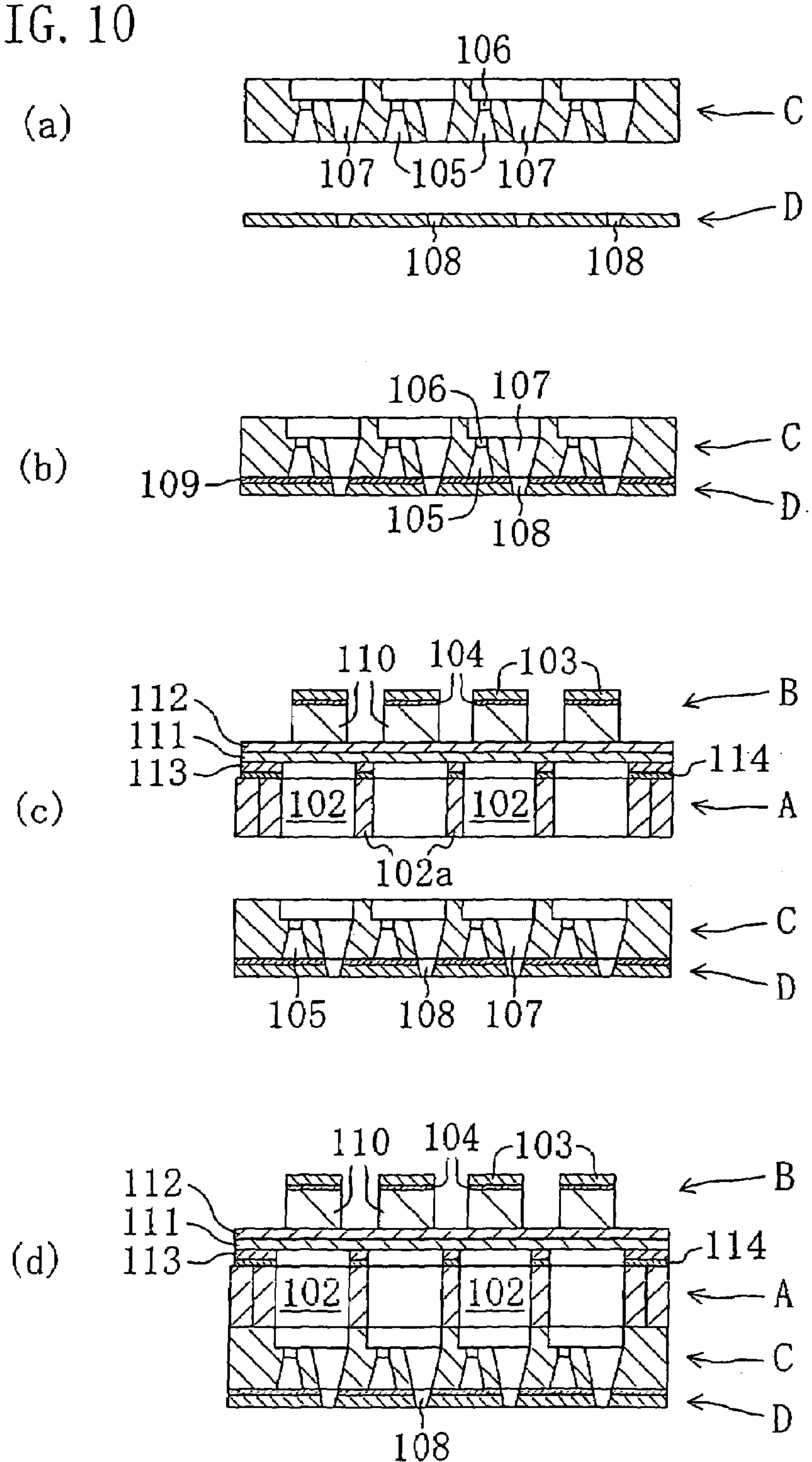
FIG. 10 illustrates a step of producing an ink channel member and a nozzle plate, a step of bonding the ink channel member and the nozzle plate to each other, a step of bonding the pressure chamber member and the ink channel member to each other, and a completed ink jet head, respectively, in the method for manufacturing the ink jet head.

Then, as illustrated in FIG. 10(*a*), the common ink chamber 105, the supply ports 106 and the ink channels 107 are formed in the ink channel member C, and the nozzle holes 108 are formed in the nozzle plate D. Then, as illustrated in FIG. 10(*b*), the ink channel member C and the nozzle plate D are bonded together with an adhesive 109.

Then, as illustrated in FIG. 10(*c*), an adhesive (not shown) is transferred onto the lower surface of the pressure chamber member A or the upper surface of the ink channel member C, and the pressure chamber member A and the ink channel member C are bonded together after they are aligned with each other. Through the process as described above, the ink jet head including the pressure chamber member A, the actuator section B, the ink channel member C and the nozzle plate D is completed, as illustrated in FIG. 10(*d*).

When a predetermined voltage is applied between the first electrode layer 103 and the second electrode layer 112 of the ink jet head obtained as described above, the displacement occurs in the thickness direction of a portion of the vibration layer 111 corresponding to each pressure chamber 102 due to the piezoelectric effect of the piezoelectric layer 110, whereby ink in the pressure chamber 102 is discharged through the nozzle hole 108 communicated to the pressure chamber 102. The displacement in the thickness direction of a portion of the vibration layer 111 corresponding to the pressure chamber 102 was measured, indicating that the deviation in the displacement was $\sigma$=1.8%. Moreover, after applying a 20 V AC voltage having a frequency of 20 kHz for 10 days, deterioration in the ink-discharge performance was not observed with no ink-discharge defect.

On the other hand, an ink jet head similar to the ink jet head of the present invention was produced except only that the orientation control layer 104 was not provided. The displacement in the thickness direction of a portion of the vibration layer 111 corresponding to the pressure chamber 102 was measured while applying a predetermined voltage between the first electrode layer 103 and the second electrode layer 112 of the ink jet head. The deviation in the displacement was $\sigma$=7.2%. Moreover, after applying a 20 V AC voltage having a frequency of 20 kHz for 10 days, an ink-discharge defect was observed in locations corresponding to about 30% of all the pressure chambers 102. This was not due to clogging of ink, etc. It is therefore believed that the actuator section B (the piezoelectric element) had a poor durability.

Thus, it can be seen that the ink jet head of the present embodiment has a desirable durability with a small deviation in the ink-discharge performance.

EMBODIMENT 3

Figure 12:
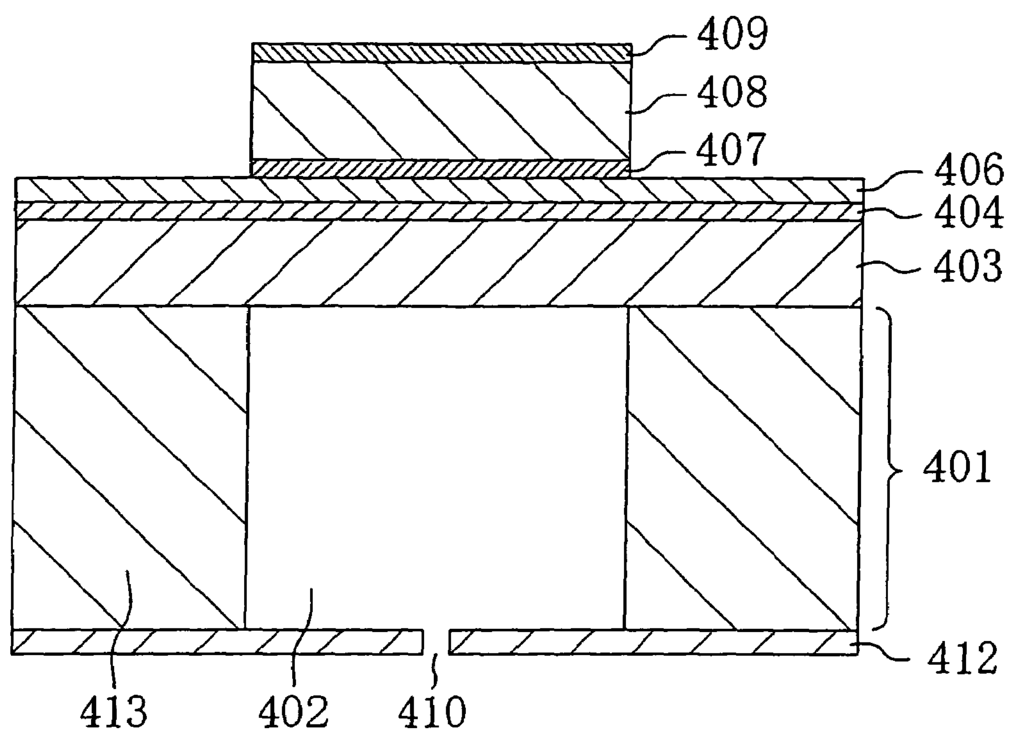
FIG. 12 is a cross-sectional view illustrating an important part of a pressure chamber member and an actuator section in another ink jet head according to an embodiment of the present invention.

FIG. 12 illustrates an important part of another ink jet head according to an embodiment of the present invention. In the ink jet head of the present embodiment, a substrate is used both for depositing films thereon and for forming the pressure chamber member, rather than using separate substrates, one for depositing films thereon and another for forming the pressure chamber member, as in the ink jet head of Embodiment 2.

Specifically, a vibration layer 403, an adhesive layer 404, a first electrode layer 406 (common electrode), an orientation control layer 407, a piezoelectric layer 408 and a second electrode layer 409 (separate electrode) are layered in this order on a pressure chamber substrate 401 (pressure chamber member) in which pressure chambers 402 have been formed by an etching process. The first electrode layer 406, the orientation control layer 407, the piezoelectric layer 408 and the second electrode layer 409 are arranged in this order to form a piezoelectric element. Moreover, the vibration layer 403 is provided on one surface of the piezoelectric element that is closer to the first electrode layer 406 via the adhesive layer 404. The adhesive layer 404 is provided for improving the adhesion between the vibration layer 403 and the first electrode layer 406, and may be omitted as the adhesive layer 121 of Embodiment 2. The materials of the adhesive layer 404, the first electrode layer 406, the orientation control layer 407, the piezoelectric layer 408 and the second electrode layer 409 are similar to those of the adhesive layer 121, the first electrode layer 103, the orientation control layer 104, the piezoelectric layer 110 and the second electrode layer 112, respectively, of Embodiment 2. Moreover, the structures of the orientation control layer 407 and the piezoelectric layer 408 are similar to those of the orientation control layer 104 and the piezoelectric layer 110, respectively. In the vicinity of one surface of the orientation control layer 407 that is closer to the first electrode layer 406, a (100)- or (001)-oriented region extends over titanium located on one surface of the first electrode layer 406 that is closer to the orientation control layer 407 so that the cross-sectional area of such a region in the direction perpendicular to the thickness direction gradually increases in the direction away from the first electrode layer 406 toward the piezoelectric layer 408.

An Si substrate having a diameter of 4 inches and a thickness of 200 μm is used as the pressure chamber substrate 401. Also in this embodiment, the substrate 401 is not limited to an Si substrate, but may alternatively be a glass substrate, a metal substrate, or a ceramic substrate.

In the present embodiment, the vibration layer 403 has a thickness of 2.8 μm and is made of silicon dioxide. Note that the material of the vibration layer 403 is not limited to silicon dioxide, but may alternatively be any of those mentioned in Embodiment 2 (nickel, chromium, etc., or an oxide or nitride thereof). Moreover, the thickness of the vibration layer 111 is not limited to any particular thickness as long as it is in the range of 0.5 to 10 μm.

Next, a method for manufacturing the ink jet head as described above will be described with reference to FIG. 13.

Figure 13:
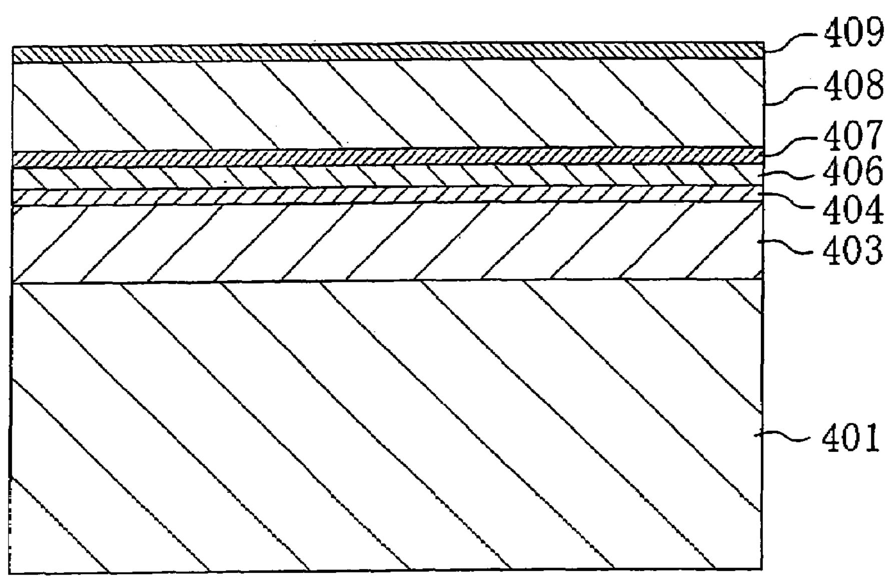
FIG. 13 illustrates a deposition step, and a step of forming a pressure chamber, respectively, in a method for manufacturing the ink jet head.
Figure 13:
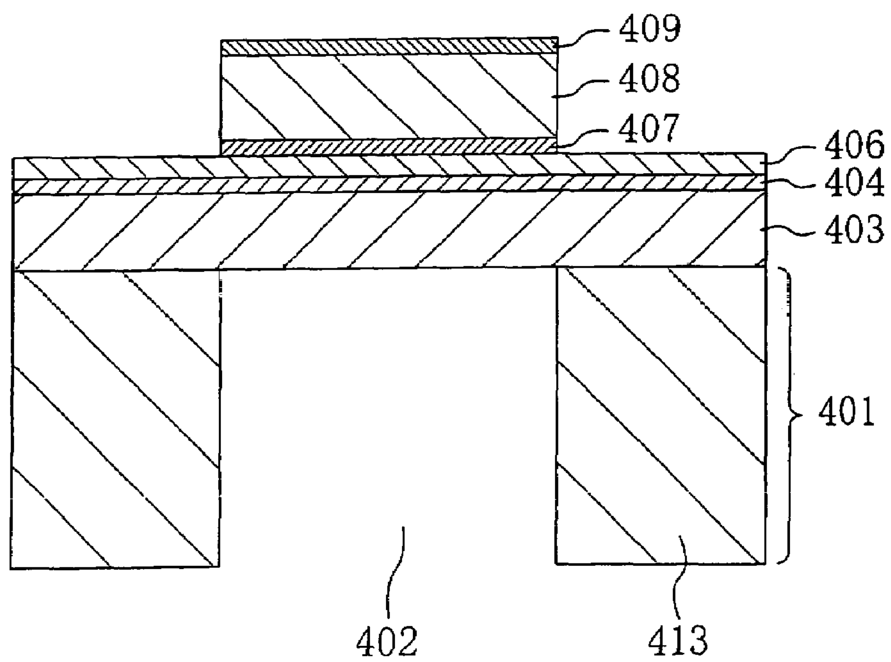

First, as illustrated in FIG. 13(*a*), the vibration layer 403, the adhesive layer 404, the first electrode layer 406, the orientation control layer 407, the piezoelectric layer 408 and the second electrode layer 409 are formed in this order by a sputtering method on the pressure chamber substrate 401 on which the pressure chambers 402 have not been formed.

The vibration layer 403 is obtained by using a silicon dioxide sinter target and applying a high-frequency power of 300 W thereto for 8 hours at a room temperature without heating the pressure chamber substrate 401 in a mixed atmosphere of argon and oxygen at 0.4 Pa (gas volume ratio: $Ar:O_2=5:25$). Note that deposition method for the vibration layer 403 is not limited to a sputtering method, but may alternatively be a thermal CVD method, a plasma CVD method, a sol-gel method, or the like, or it may alternatively be formed through a thermal oxidization process on the pressure chamber substrate 401.

The adhesive layer 404 is obtained by using a Ti target and applying a high-frequency power of 100 W thereto for 1 minute while heating the pressure chamber substrate 401 to 400° C. in an argon gas at 1 Pa. The thickness of the adhesive layer 404 is 0.03 μm. Note that the material of the adhesive layer 404 is not limited to Ti, but may alternatively be tantalum, iron, cobalt, nickel, chromium, or a compound thereof (including Ti). Moreover, the thickness is not limited to any particular thickness as long as it is in the range of 0.005 to 0.1 μm.

The first electrode layer 406 was obtained by using a Ti target and a Pt target and applying high-frequency powers of 85 W and 200 W thereto, respectively, for 12 minutes while heating the pressure chamber substrate 401 to 600° C. in an argon gas at 1 Pa, using a multi-target sputtering apparatus. The first electrode layer 406 has a thickness of 0.2 μm, and is oriented along the (111) plane. Moreover, the Ti content is 2.5 mol %. As is the first electrode layer 14 of Embodiment 1, the first electrode layer 406 may be made of at least one noble metal selected from the group consisting of Pt, iridium, palladium and ruthenium to which titanium or titanium oxide is added (the amount of the additive to be added is preferably greater than zero and less than or equal to 30 mol %), and the thickness thereof is not limited to any particular thickness as long as it is in the range of 0.05 to 2 μm.

The orientation control layer 407 is obtained by using a sinter target prepared by adding a 15 mol % excess of lead oxide (PbO) to PLT containing 10 mol % of lanthanum and applying a high-frequency power of 300 W thereto for 12 minutes while heating the pressure chamber substrate 401 to 620° C. in a mixed atmosphere of argon and oxygen (gas volume ratio: $Ar:O_2=19:1$) at a degree of vacuum of 0.8 Pa. The obtained lead lanthanum titanate film is the same as the orientation control layer 104 of Embodiment 2.

Note that as with the orientation control layer 15 of Embodiment 1, the La content of the orientation control layer 407 may be greater than zero and less than or equal to 25 mol %, and the lead content thereof may be in excess of the stoichiometric composition by an amount greater than zero and less than or equal to 30 mol %. Moreover, the material of the orientation control layer 407 may be PLZT obtained by adding zirconium to PLT (the zirconium content is preferably 20 mol % or less), or may be a material obtained by adding at least one of magnesium and manganese to PLT or PLZT (the amount of magnesium and manganese to be added is preferably greater than zero and less than or equal to 10 mol %). Moreover, the thickness of the orientation control layer 104 is not limited to any particular thickness as long as it is in the range of 0.01 to 0.2 μm.

The piezoelectric layer 408 is obtained by using a sinter target of PZT (Zr/Ti=52/48) and applying a high-frequency power of 250 W thereto for 3 hours while heating the pressure chamber substrate 401 to 580° C. in a mixed atmosphere of argon and oxygen (gas volume ratio: $Ar:O_2=15:1$) at a degree of vacuum of 0.3 Pa. The obtained PZT film is the same as the piezoelectric layer 110 of Embodiment 2. Note that the Zr/Ti composition of the piezoelectric layer 408 is not limited to any particular composition as long as it is in the range of 30/70 to 70/30, and the thickness thereof is not limited to any particular thickness as long as it is in the range of 1 to 5 μm. Moreover, the material of the piezoelectric layer 408 is not limited to any particular material, as long as it is a piezoelectric material whose main component is PZT, e.g., those obtained by adding an additive such as Sr, Nb or Al to PZT. For example, PMN or PZN may be used.

The second electrode layer 409 is obtained by using a Pt target and applying a high-frequency power of 200 W thereto for 10 minutes at a room temperature in an argon gas at 1 Pa. The thickness of the second electrode layer 409 is 0.2 μm. Note that the material of the second electrode layer 409 is not limited to Pt as long as it is a conductive material, and the thickness thereof is not limited to any particular thickness as long as it is in the range of 0.1 to 0.4 μm.

Then, a resist is applied by a spin coating method on the second electrode layer 409, and then patterned through exposure and development processes into a pattern corresponding to the pressure chambers 402 to be formed. Then, the second electrode layer 409, the piezoelectric layer 408 and the orientation control layer 407 are divided into portions by etching. The etching process is a dry etching process using a mixed gas of argon and an organic gas including fluorine element.

Then, as illustrated in FIG. 13(*b*), the pressure chambers 402 are formed in the pressure chamber substrate 401. The pressure chambers 402 are formed by an anisotropic dry etching process using a sulfur hexafluoride gas, an organic gas including fluorine element, or a mixed gas thereof. Specifically, the pressure chambers 402 are formed by performing an anisotropic dry etching after forming an etching mask on one surface of the pressure chamber substrate 401 that is opposite to the other surface thereof on which various films have been formed so as to cover each portion thereof corresponding to a side wall 413 to be formed.

Then, a nozzle plate 412 with nozzle holes 410 formed therein is bonded to the surface of the pressure chamber substrate 401 that is opposite to the other surface thereof on which various films have been formed, thereby obtaining the ink jet head. The nozzle holes 410 are opened at predetermined positions in the nozzle plate 412 by a photolithography method, a laser processing method, an electrical discharge machining method, or the like. Then, before the nozzle plate 412 is bonded to the pressure chamber substrate 401, they are aligned with each other so that the nozzle holes 410 correspond to the pressure chambers 402, respectively.

The displacement in the thickness direction of a portion of the vibration layer 403 corresponding to the pressure chamber 402 was measured while applying a predetermined voltage between the first electrode layer 406 and the second electrode layer 409 of an ink jet head obtained as described above. The deviation in the displacement was $\sigma=1.8\%$. Moreover, after applying a 20 V AC voltage having a frequency of 20 kHz for 10 days, deterioration in the ink-discharge performance was not observed with no ink-discharge defect.

On the other hand, an ink jet head similar to the ink jet head of the present invention was produced except only that the orientation control layer 407 was not provided. The displacement in the thickness direction of a portion of the vibration layer 403 corresponding to the pressure chamber 402 was measured while applying a predetermined voltage between the first electrode layer 406 and the second electrode layer 409 of the ink jet head. The deviation in the displacement was $\sigma=5.8\%$. Moreover, after applying a 20 V AC voltage having a frequency of 20 kHz for 10 days, an ink-discharge defect was observed in locations corresponding to about 25% of all the pressure chambers 402. This was not due to clogging of ink, etc. It is therefore believed that the actuator section (the piezoelectric element) had a poor durability.

Thus, it can be seen that the ink jet head of the present embodiment has a desirable durability and a small deviation in the ink-discharge performance, as the ink jet head of Embodiment 2.

EMBODIMENT 4

Figure 14:
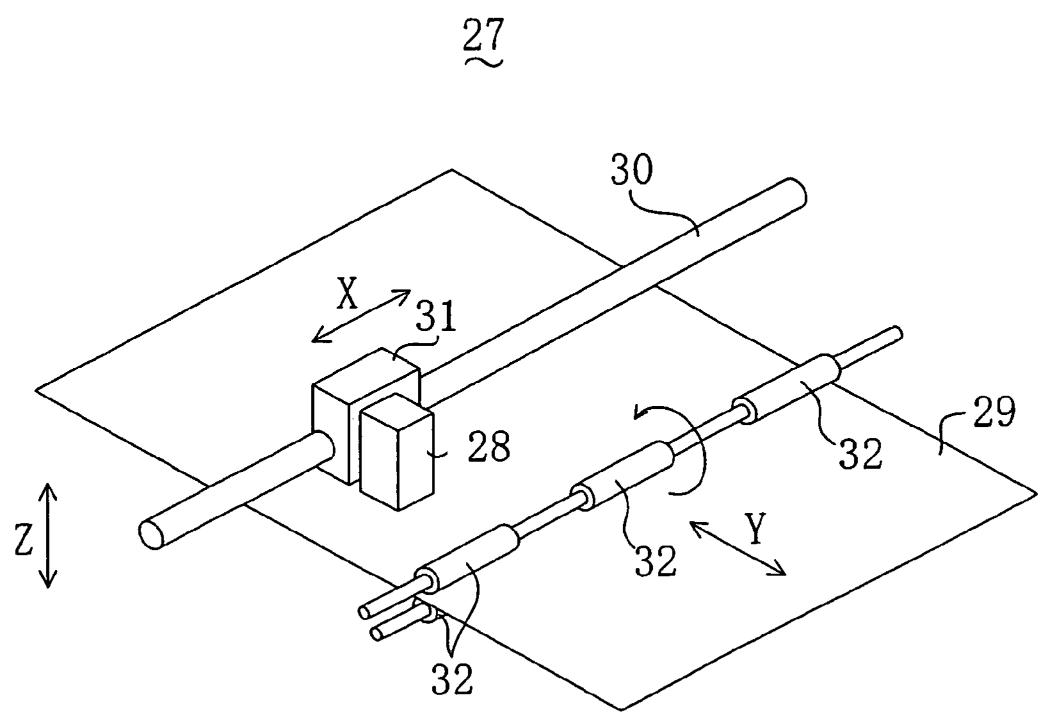
FIG. 14 is a schematic perspective view illustrating an ink jet recording apparatus according to an embodiment of the present invention.

FIG. 14 illustrates an ink jet recording apparatus 27 according to an embodiment of the present invention. The ink jet recording apparatus 27 includes an ink jet head 28, which is similar to the ink jet head of Embodiment 2 or 3. The ink jet head 28 is configured so that ink in each pressure chamber (the pressure chamber 102 of Embodiment 2 or the pressure chamber 402 of Embodiment 3) is discharged through a nozzle hole (the nozzle hole 108 of Embodiment 2 or the nozzle hole 410 of Embodiment 3), which is communicated to the pressure chamber, onto a recording medium 29 (e.g., recording paper) for recording information.

The ink jet head 28 is mounted on a carriage 31, which is provided on a carriage shaft 30 extending in the primary scanning direction X, and is reciprocated in the primary scanning direction X as the carriage 31 reciprocates along the carriage shaft 30. Thus, the carriage 31 forms relative movement means for relatively moving the ink jet head 28 and the recording medium 29 with respect to each other in the primary scanning direction X.

Moreover, the ink jet recording apparatus 27 includes a plurality of rollers 32 for moving the recording medium 29 in the secondary scanning direction Y, which is substantially perpendicular to the primary scanning direction X (width direction) of the ink jet head 28. Thus, the plurality of rollers 32 together form relative movement means for relatively moving the ink jet head 28 and the recording medium 29 with respect to each other in the secondary scanning direction Y. Note that in FIG. 14, arrow Z represents the vertical direction.

While the ink jet head 28 is moved by the carriage 31 from one side to the other in the primary scanning direction X, ink is discharged through the nozzle holes of the ink jet head 28 onto the recording medium 29. After one scan of recording operation, the recording medium 29 is moved by the rollers 32 by a predetermined amount, and then the next scan of recording operation is performed.

Since the ink jet recording apparatus 27 includes the ink jet head 28 similar to that of Embodiment 2 or 3, the ink jet recording apparatus 27 provides a desirable printing performance and durability.

EMBODIMENT 5

Figure 15:
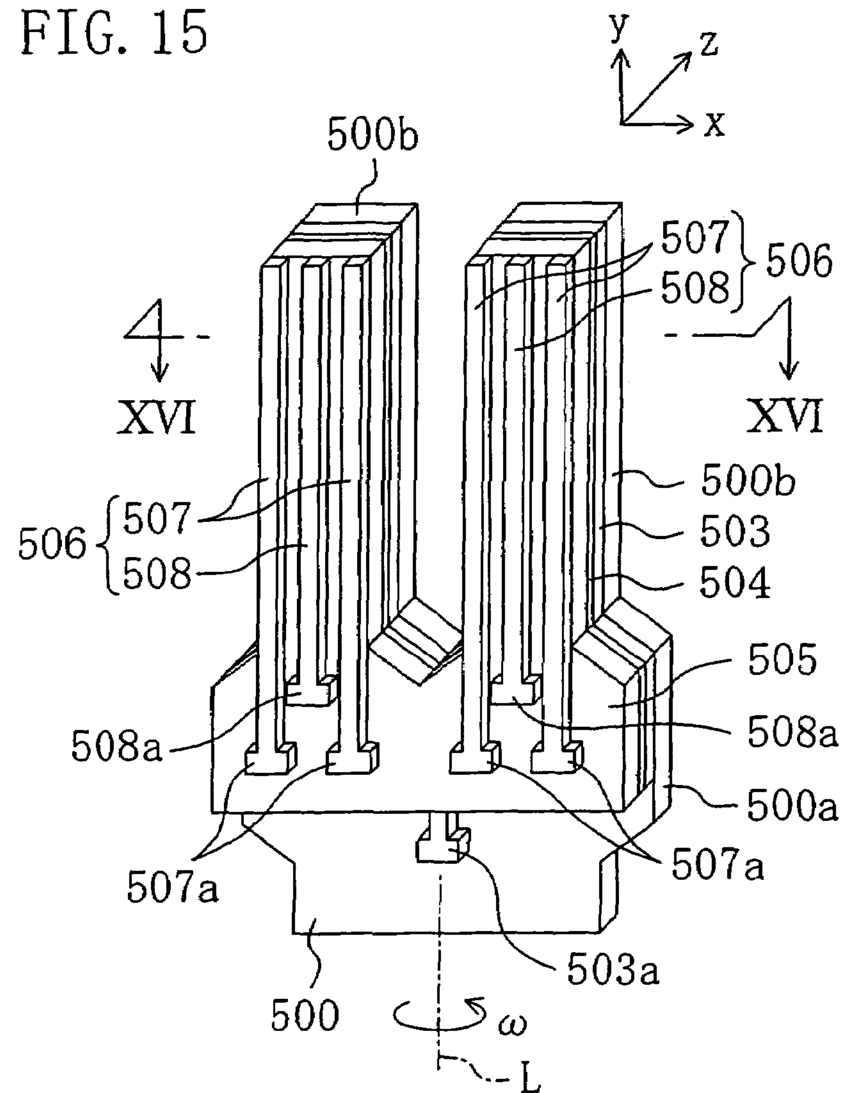
FIG. 15 is a schematic perspective view illustrating an angular velocity sensor according to an embodiment of the present invention.
Figure 16:
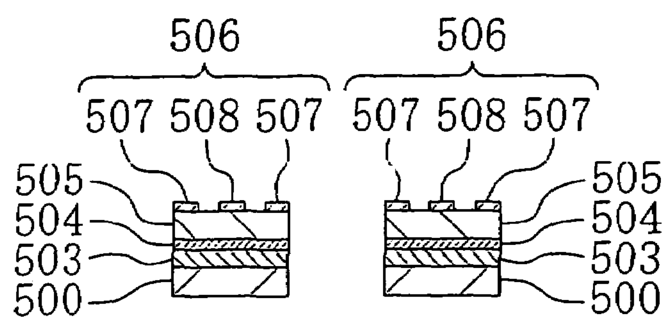
FIG. 16 is a cross-sectional view taken along line XVI-XVI of FIG. 15.

FIG. 15 and FIG. 16 illustrate an angular velocity sensor according to an embodiment of the present invention. The angular velocity sensor has a shape of a tuning fork, and can suitably be used in a vehicle-mounted navigation system, or the like.

The angular velocity sensor includes a substrate 500 made of a silicon wafer having a thickness of 0.3 mm (the substrate 500 may alternatively be a glass substrate, a metal substrate or a ceramic substrate). The substrate 500 includes a fixed portion 500*a*, and a pair of vibrating portions 500*b* extending from the fixed portion 500*a* in a predetermined direction (the direction of the rotation axis with respect to which the angular velocity is to be detected; the y direction in FIG. 15 in the present embodiment). The fixed portion 500*a* and the pair of vibrating portions 500*b* together form a shape of a tuning fork as viewed in the thickness direction of the substrate 500 (the z direction in FIG. 15), and the pair of vibrating portions 500*b*, corresponding to the arms of a tuning fork, extend in parallel to each other while being arranged next to each other in the width direction of the vibrating portions 500*b*.

A first electrode layer 503, an orientation control layer 504, a piezoelectric layer 505 and a second electrode layer 506 are layered in this order on the vibrating portions 500*b* of the substrate 500 and a portion of the fixed portion 500*a* close to the vibrating portions 500*b*. Note that also in the angular velocity sensor, it is preferred that an adhesive layer is provided between the substrate 500 and the first electrode layer 503, as in the piezoelectric element of Embodiment 1.

The materials and the thicknesses of the first electrode layer 503, the orientation control layer 504, the piezoelectric layer 505 and the second electrode layer 506 are similar to those of the first electrode layer 14, the orientation control layer 15, the piezoelectric layer 16 and the second electrode layer 17, respectively, of Embodiment 1. Moreover, the structures of the orientation control layer 504 and the piezoelectric layer 505 are similar to those of the orientation control layer 15 and the piezoelectric layer 16, respectively. In the vicinity of one surface of the orientation control layer 504 that is closer to the first electrode layer 503, a (100)- or (001)-oriented region extends over titanium located on one surface of the first electrode layer 503 that is closer to the orientation control layer 504 so that the cross-sectional area of such a region in the direction perpendicular to the thickness direction gradually increases in the direction away from the first electrode layer 503 toward the piezoelectric layer 505.

On each vibrating portion 500*b*, the second electrode layer 506 is patterned into three portions, i.e., two driving electrodes 507 for vibrating the vibrating portion 500*b* in the width direction thereof (the x direction in FIG. 15), and a detection electrode 508 for detecting a displacement (deflection) of the vibrating portion 500*b* in the thickness direction thereof (the z direction).

The two driving electrodes 507 extend along the lateral edges of the vibrating portion 500*b* that are opposing each other with respect to the width direction thereof (the x direction) and entirely across the vibrating portion 500*b* in the longitudinal direction thereof (the y direction). One end of each driving electrode 507 that is closer to the fixed portion 500*a* forms a connection terminal 507*a* on the fixed portion 500*a*. Note that only one driving electrode 507 may alternatively be provided on one of the opposite edges of each vibrating portion 500*b*.

On the other hand, the detection electrode 508 extends in the central portion of the vibrating portion 500*b* with respect to the width direction thereof and entirely across the vibrating portion 500*b* in the longitudinal direction thereof As does the driving electrode 507, one end of the detection electrode 508 that is closer to the fixed portion 500*a* forms a connection terminal 508*a* on the fixed portion 500*a*. Note that a plurality of detection electrodes 508 may alternatively be provided on each vibrating portion 500*b*.

Note that the first electrode layer 503 forms a connection terminal 503*a*, extending away from the vibrating portion 500*b*, on the fixed portion 500*a* between the pair of vibrating portions 500*b*.

Applied between the first electrode layer 503 and the two driving electrodes 507 on the vibrating portion 500*b* is a voltage having a frequency that is resonant with the proper oscillation of the vibrating portion 500*b* so that the vibrating portion 500*b* vibrates in the width direction thereof Specifically, two voltages of opposite polarity are applied to the two driving electrodes 507 while the ground voltage is applied to the first electrode layer 503, whereby when one lateral edge of the vibrating portion 500*b* expands, the other lateral edge contracts, and thus the vibrating portion 500*b* deforms toward the second lateral edge. On the other hand, when the first lateral edge of the vibrating portion 500*b* contracts, the second lateral edge expands, and thus the vibrating portion 500*b* deforms toward the first lateral edge. By repeating this operation, the vibrating portion 500*b* vibrates in the width direction thereof Note that by applying a voltage to only one of the two driving electrodes 500*b* on each vibrating portion 500*b*, the vibrating portion 500*b* can be vibrated in the width direction thereof. The pair of vibrating portions 500*b* are configured so that they deform in opposite directions with respect to the width direction thereof and in symmetry with each other with respect to the center line L, which extends in the longitudinal direction of the vibrating portion 500*b* between the pair of vibrating portions 500*b*.

In the angular velocity sensor having such a configuration, if an angular velocity (o about the center line L is applied while the pair of vibrating portions 500*b* are being vibrated in the width direction thereof (the x direction) symmetrically with respect to the center line L, the two vibrating portions 500*b* are bent and deformed in the thickness direction (the z direction) by the Coriolis force (the pair of vibrating portions 500*b* are bent by the same amount but in opposite directions), thereby also bending the piezoelectric layer 505, and thus generating a voltage according to the magnitude of the Coriolis force between the first electrode layer 503 and the detection electrode 508. Then, the angular velocity (o can be calculated based on the magnitude of the voltage (the Coriolis force).

The Coriolis force Fc is expressed as follows:

$$Fc=2\ mv\omega,$$

where v denotes the velocity of each vibrating portion 500*b* in the width direction, and m denotes the mass of each vibrating portion 500*b*.

Thus, the value of the angular velocity ω can be obtained from the Coriolis force Fc.

Next, a method for manufacturing the angular velocity sensor will be described with reference to FIG. 17 and FIG. 18.

Figure 17:
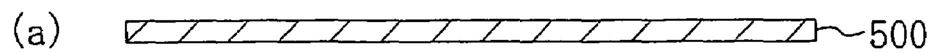
FIG. 17 illustrates a method for manufacturing the angular velocity sensor.
Figure 17:
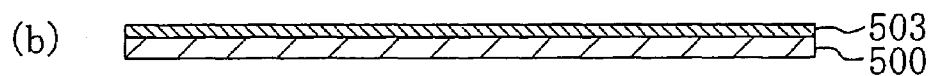
Figure 17:
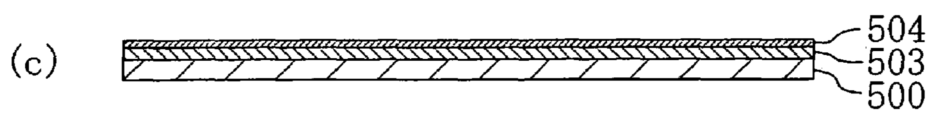
Figure 17:
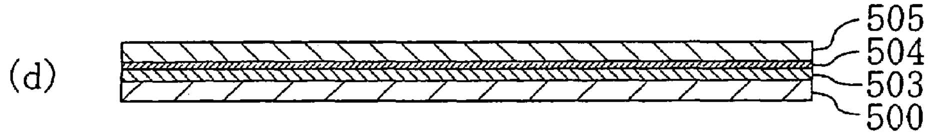
Figure 17:
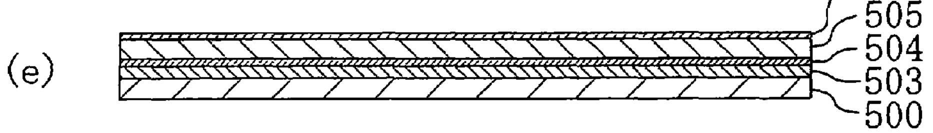
Figure 17:
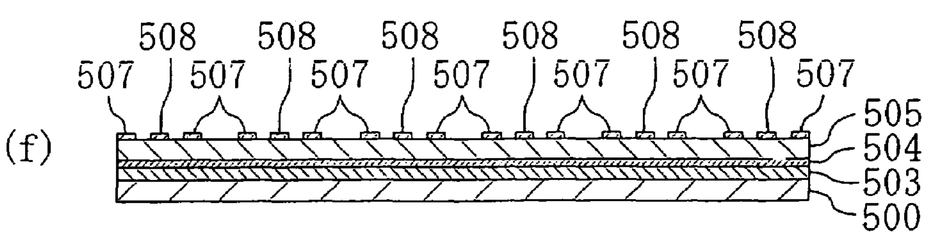
Figure 18:
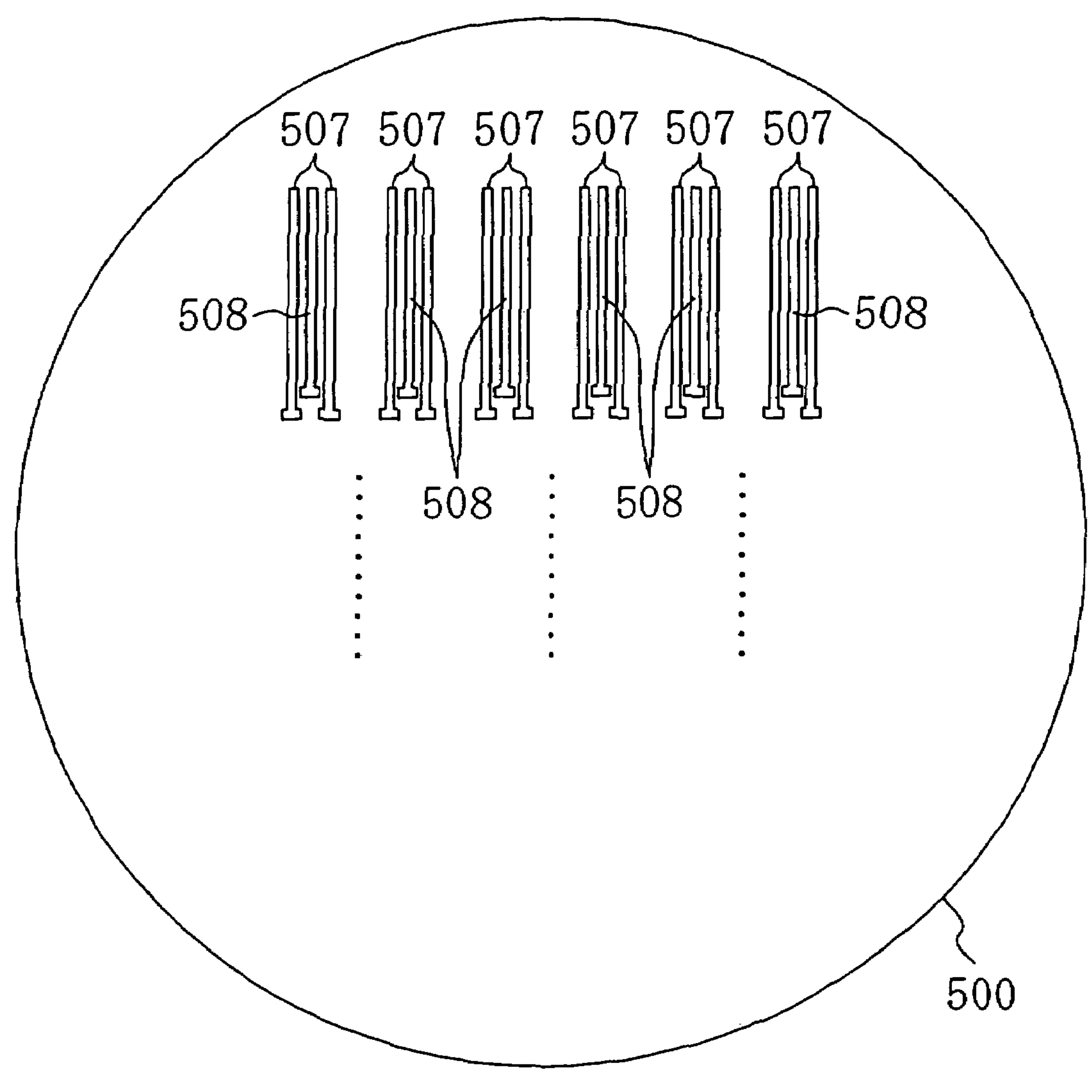
FIG. 18 is a plan view illustrating the method for manufacturing the angular velocity sensor after a second electrode layer is patterned.

As illustrated in FIG. 17(*a*), the substrate 500 made of a 4-inch silicon wafer having a thickness of 0.3 mm is provided (see the plan view of FIG. 18). Then, as illustrated in FIG. 17(*b*), the first electrode layer 503 is formed of iridium (Ir) to which 2.1 mol % of Ti is added on the substrate 500 by a sputtering method so as to have a thickness of 0.22 μm. The first electrode layer 503 is obtained by using a Ti target and a Pt target and applying high-frequency powers of 85 W and 200 W thereto, respectively, for 12 minutes while heating the substrate 500 to 400° C. in an argon gas at 1 Pa, using a multi-target sputtering apparatus. Titanium exists in a dotted pattern on a surface of the first electrode layer 503, and the titanium protrudes less than 2 nm from the surface.

Then, as illustrated in FIG. 17(*c*), the orientation control layer 504 is formed on the first electrode layer 503 by a sputtering method so as to have a thickness of 0.03 μm. The orientation control layer 504 is obtained by using a sinter target prepared by adding a 12 mol % excess of lead oxide (PbO) to PLT containing 14 mol % of lanthanum and applying a high-frequency power of 300 W thereto for 12 minutes while heating the substrate 500 to 600° C. in a mixed atmosphere of argon and oxygen (gas volume ratio: $Ar:O_2$=19:1) at a degree of vacuum of 0.8 Pa. According to this production method, as described above in Embodiment 1, in the vicinity of one surface of the orientation control layer 504 that is closer to the first electrode layer 503, a (100)- or (001)-oriented region extends over titanium so that the cross-sectional area of the region in the direction perpendicular to the thickness direction gradually increases in the upward direction away from the first electrode layer 503.

Then, as illustrated in FIG. 17(*d*), the piezoelectric layer 505 is formed on the orientation control layer 504 by a sputtering method so as to have a thickness of 3 μm. The piezoelectric layer 505 is obtained by using a sinter target of PZT (Zr/Ti=53/47) and applying a high-frequency power of 250 W thereto for 3 hours while heating the substrate 500 to 610° C. in a mixed atmosphere of argon and oxygen (gas volume ratio: $Ar:O_2$=19:1) at a degree of vacuum of 0.3 Pa. The piezoelectric layer 505 is rhombohedral, with the degree of (001) orientation thereof being 90% or more, as described in Embodiment 1.

Then, as illustrated in FIG. 17(*e*), the second electrode layer 506 is formed on the piezoelectric layer 505 by a sputtering method so as to have a thickness of 0.2 μm. The second electrode layer 506 is obtained by using a Pt target and applying a high-frequency power of 200 W thereto for 10 minutes at a room temperature in an argon gas at 1 Pa.

Then, as illustrated in FIG. 17(*f*) and FIG. 18, the second electrode layer 506 is patterned so as to form the driving electrodes 507 and the detection electrode 508. Specifically, a photosensitive resin is applied on the second electrode layer 506 and is exposed to light to form the pattern of the driving electrodes 507 and the detection electrode 508, and the unexposed portions of the photosensitive resin are removed. The second electrode layer 506 is etched and removed in locations where the photosensitive resin has been removed. Then, the photosensitive resin on the driving electrodes 507 and the detection electrode 508 is removed.

After patterning the second electrode layer 506, the piezoelectric layer 505, the orientation control layer 504 and the first electrode layer 503 are patterned in similar steps, and the substrate 500 is patterned, thereby forming the fixed portion 500*a* and the vibrating portions 500*b*. Thus, the angular velocity sensor is obtained.

Note that the deposition method for the various layers is not limited to a sputtering method, but may alternatively be any other suitable deposition method as long as a crystalline thin film is directly formed without the crystallization step using a heat treatment (e.g., a CVD method).

Figure 19:
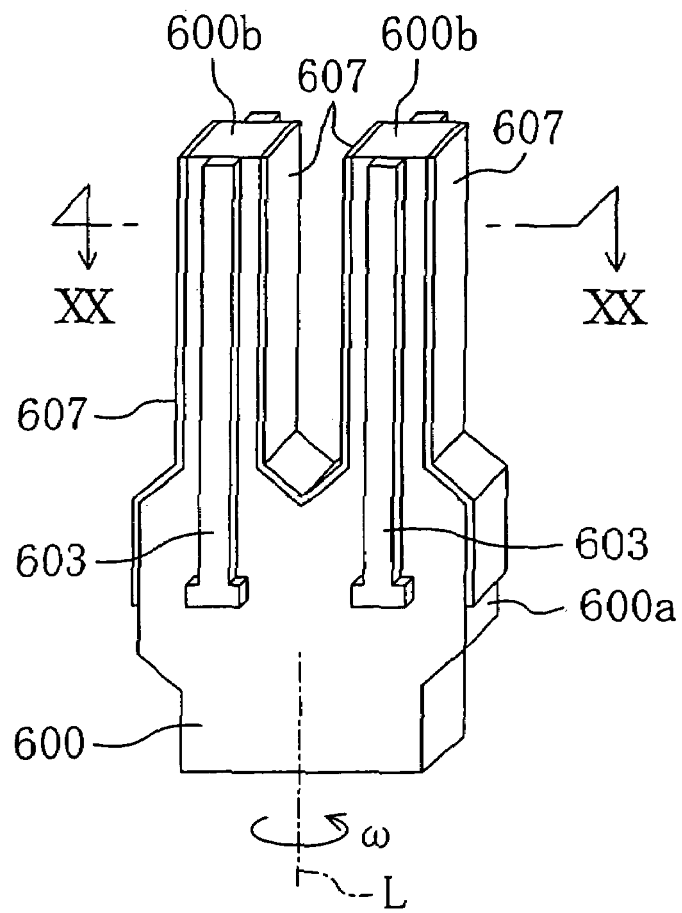
FIG. 19 is a schematic perspective view illustrating a conventional angular velocity sensor using quartz.
Figure 20:
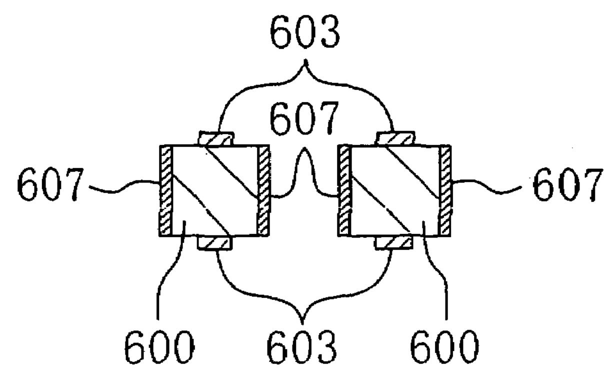
FIG. 20 is a cross-sectional view taken along line XX-XX of FIG. 19.

Now, a conventional angular velocity sensor will be described with reference to FIG. 19 and FIG. 20.

The conventional angular velocity sensor includes a piezoelectric member 600 made of quartz having a thickness of 0.3 mm. As does the substrate 500 of the angular velocity sensor of the present embodiment, the piezoelectric member 600 includes a fixed portion 600*a*, and a pair of vibrating portions 600*b* extending from the fixed portion 600*a* in one direction (the y direction in FIG. 19) in parallel to each other. The driving electrodes 603 for vibrating the vibrating portion 600*b* in the width direction thereof (the x direction in FIG. 19) are provided respectively on two surfaces of the vibrating portion 600*b* opposing each other in the thickness direction thereof (the z direction in FIG. 19), and detection electrodes 607 for detecting the displacement of the vibrating portion 600*b* in the thickness direction are provided respectively on two side surfaces of the vibrating portion 600*b*.

In the conventional angular velocity sensor, a voltage having a frequency that is resonant with the proper oscillation of the vibrating portion 600*b* is applied between the two driving electrodes 603 of each vibrating portion 600*b* so as to vibrate the pair of vibrating portions 600*b* in the width direction thereof (the x direction) symmetrically with respect to the center line L between the pair of vibrating portions 600*b*, as in the angular velocity sensor of the present embodiment. If an angular velocity ω about the center line L is applied in this state, the pair of vibrating portions 600*b* are bent and deformed in the thickness direction (the z direction) by the Coriolis force, thereby generating a voltage according to the magnitude of the Coriolis force between the two the detection electrodes 607 of each vibrating portion 600*b*. Then, the angular velocity ω can be calculated based on the magnitude of the voltage (the Coriolis force).

Since the conventional angular velocity sensor uses the piezoelectric member 600 made of quartz, the piezoelectric constant is as low as −3 pC/N. Moreover, since the fixed portion 600*a* and the vibrating portion 600*b* are machined, it is difficult to reduce the size thereof, and the dimensional precision thereof is low.

In contrast, in the angular velocity sensor of the present embodiment, the portion for detecting the angular velocity (the vibrating portion 500*b*) is the piezoelectric element having a similar structure to that of Embodiment 1. Therefore, the piezoelectric constant can be increased to be about 40 times as large as that of the conventional angular velocity sensor, and thus the size thereof can be reduced significantly. Moreover, minute processing with thin film formation techniques can be used, thereby significantly improving the dimensional precision. Furthermore, even if the angular velocity sensors are mass-produced industrially, it is possible to obtain angular velocity sensors with a high characteristics reproducibility and a small characteristics deviation, and with a high breakdown voltage and a high reliability.

Note that also in the angular velocity sensor of the present embodiment, as in the piezoelectric element of Embodiment 1, the orientation control layer 504 is preferably made of lead lanthanum zirconate titanate whose zirconium content is equal to or greater than zero and less than or equal to 20 mol % and whose lead content is in excess of the stoichiometric composition by an amount greater than zero and less than or equal to 30 mol %, or made of the lead lanthanum zirconate titanate to which at least one of magnesium and manganese is added. The lanthanum content of the lead lanthanum zirconate titanate is preferably greater than zero and less than or equal to 25 mol %. When at least one of magnesium and manganese is added to the lead lanthanum zirconate titanate, the total amount thereof to be added is preferably greater than zero and less than or equal to 10 mol %.

Moreover, the first electrode layer 503 is desirably made of at least one noble metal selected from the group consisting of platinum, iridium, palladium and ruthenium, which contains titanium or titanium oxide. The content of titanium or titanium oxide contained in the noble metal is desirably greater than zero and less than or equal to 30 mol %.

Furthermore, the piezoelectric layer 505 is desirably made of a piezoelectric material whose main component is PZT (the piezoelectric material may be composed only of PZT).

Furthermore, while only one pair of vibrating portions 500*b* is provided in the substrate 500 in the angular velocity sensor of the present embodiment, a plurality of pairs of vibrating portions may alternatively be provided so as to detect angular velocities with respect to a plurality of axes extending in different directions.

Moreover, while the first electrode layer 503, the orientation control layer 504, the piezoelectric layer 505 and the second electrode layer 506 are layered in this order on the vibrating portions 500*b* of the substrate 500 and a portion of the fixed portion 500*a* close to the vibrating portions 500*b* in the angular velocity sensor of the present embodiment, these layers may alternatively be layered only on the vibrating portions 500*b*.

In addition, while the piezoelectric element of the present invention is applied to an ink jet head (an ink jet recording apparatus) and an angular velocity sensor in the embodiments described above, the piezoelectric element of the present invention may be used in various other applications including, but not limited to, thin film condensers, charge storage capacitors of non-volatile memory devices, various kinds of actuators, infrared sensors, ultrasonic sensors, pressure sensors, acceleration sensors, flow meters, shock sensors, piezoelectric transformers, piezoelectric igniters, piezoelectric speakers, piezoelectric microphones, piezoelectric filters, piezoelectric pickups, tuning-fork oscillators, and delay lines. Particularly, the piezoelectric element of the present invention may suitably be used in a thin film piezoelectric actuator for a disk apparatus provided in a head supporting mechanism, in which a head for recording or reproducing information to/from a disk being spun in a disk apparatus (a disk apparatus used as a storage device of a computer, etc.) is provided on a substrate, wherein the substrate is deformed and the head is displaced by a thin film piezoelectric element provided on the substrate (see, for example, Japanese Unexamined Patent Publication No. 2001-332041). The thin film piezoelectric element has a similar structure to that described in the embodiments above, in which the first electrode layer, the orientation control layer, the piezoelectric layer and the second electrode layer are layered in this order, with the second electrode layer being bonded to the substrate.

INDUSTRIAL APPLICABILITY

A piezoelectric element of the present invention possesses high industrial applicability in respect that it is useful for various actuators, such as an ink-discharge actuator in an ink jet head of an ink jet recording apparatus, or the like, and for various sensors, such as a tuning fork-shaped angular velocity sensor, or the like, and that a highly-reliable piezoelectric element having superior piezoelectric characteristics is realized at a low cost.

The invention claimed is:

1. An angular velocity sensor, comprising a substrate including a fixed portion and at least a pair of vibrating portions extending from the fixed portion in a predetermined direction, in which a first electrode layer, an orientation control layer, a piezoelectric layer and a second electrode layer are layered in this order at least on each of the vibrating portions of the substrate, and the second electrode layer on each of the vibrating portions is patterned into at least one driving electrode for vibrating the vibrating portion in a width direction thereof and at least one detection electrode for detecting a displacement of the vibrating portion in a thickness direction thereof, wherein:

the first electrode layer is made of a noble metal containing titanium or titanium oxide, the orientation control layer is made of a cubic or tetragonal perovskite oxide that is preferentially oriented along a (100) or (001) plane, the piezoelectric layer is made of a rhombohedral or tetragonal perovskite oxide that is preferentially oriented along a (001) plane, and in the vicinity of one surface of the orientation control layer that is closer to the first electrode layer, a (100)- or (001)-oriented region extends over titanium or titanium oxide located on one surface of the first electrode layer that is closer to the orientation control layer, and the cross-sectional area of the (100)- or (001)-oriented region in the direction perpendicular to the thickness direction gradually increases in the direction away from the first electrode layer toward the piezoelectric layer.

2. An angular velocity sensor according to claim 1, wherein the orientation control layer is made of lead lanthanum zirconate titanate whose zirconium content is equal to or greater than zero and less than or equal to 20 mol % and whose lead content is in excess of the stoichiometric composition by an amount greater than zero and less than or equal to 30 mol %, or made of the lead lanthanum zirconate titanate to which at least one of magnesium and manganese is added.

3. An angular velocity sensor according to claim 2, wherein the lanthanum content of the lead lanthanum zirconate titanate is greater than zero and less than or equal to 25 mol %.

4. An angular velocity sensor according to claim 2, wherein when at least one of magnesium and manganese is added to the lead lanthanum zirconate titanate, the total amount thereof to be added is greater than zero and less than or equal to 10 mol %.

5. An angular velocity sensor according to claim 1, wherein the first electrode layer is made of at least one noble metal selected from the group consisting of platinum, iridium, palladium and ruthenium, and the content of the titanium or titanium oxide which is contained in the noble metal is greater than zero and less than or equal to 30 mol %.

6. An angular velocity sensor according to claim 1, wherein titanium or titanium oxide existing at a surface of the first electrode layer that is closer to the orientation control layer protrudes less than 2 nm from the surface.

7. An angular velocity sensor according to claim 1, wherein the piezoelectric layer is made of a piezoelectric material whose main component is lead zirconate titanate.

8. An angular velocity sensor according to claim 1, wherein an adhesive layer for improving adhesion between the substrate and the first electrode layer is provided between the substrate and the first electrode layer.

* * * * *